(12) United States Patent
Grebs

(10) Patent No.: US 8,319,290 B2
(45) Date of Patent: Nov. 27, 2012

(54) TRENCH MOS BARRIER SCHOTTKY RECTIFIER WITH A PLANAR SURFACE USING CMP TECHNIQUES

(75) Inventor: Thomas E. Grebs, South Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 127 days.

(21) Appl. No.: 12/819,109

(22) Filed: Jun. 18, 2010

(65) Prior Publication Data

US 2011/0309470 A1    Dec. 22, 2011

Related U.S. Application Data

(63) Continuation of application No. 12/819,023, filed on Jun. 18, 2010.

(51) Int. Cl.
*H01L 21/70* (2006.01)

(52) U.S. Cl. ............... 257/374; 257/377; 257/E29.02; 257/E21.552; 257/E21.553; 438/207; 438/439

(58) Field of Classification Search ............ 257/262, 257/272, 368, 369, 371, 374, 377, 383, 384, 257/396, 397, 647, E29.02, E29.271, E21.552, 257/E21.553, E21.555; 438/135, 142, 151, 438/197, 199, 201, 207, 216, 225, 226, 228, 438/230, 297, 362, 363, 439, 442
See application file for complete search history.

(56) References Cited

U.S. PATENT DOCUMENTS

| | | |
|---|---|---|
| 3,404,295 A | 10/1968 | Warner et al. |
| 3,412,297 A | 11/1968 | Amlinger |
| 3,497,777 A | 2/1970 | Teszner et al. |
| 3,564,356 A | 2/1971 | Wilson |
| 3,660,697 A | 5/1972 | Berglund et al. |
| 3,855,009 A | 12/1974 | Lloyd et al. |
| 4,003,072 A | 1/1977 | Matsushita et al. |
| 4,011,105 A | 3/1977 | Paivinen et al. |
| 4,062,747 A | 12/1977 | Chang et al. |
| 4,300,150 A | 11/1981 | Colak |
| 4,324,038 A | 4/1982 | Chang et al. |
| 4,326,332 A | 4/1982 | Kenney |
| 4,337,474 A | 6/1982 | Yukimoto |
| 4,345,265 A | 8/1982 | Blanchard |
| 4,445,202 A | 4/1984 | Goetze et al. |
| 4,541,001 A | 9/1985 | Schutten et al. |
| 4,568,958 A | 2/1986 | Baliga |
| 4,579,621 A | 4/1986 | Hine |

(Continued)

FOREIGN PATENT DOCUMENTS

CN      1036666 A      10/1989

(Continued)

OTHER PUBLICATIONS

"CoolMOS.TM. the second generation," Infineon Technologies product information (2000), 2 pages total.

(Continued)

*Primary Examiner* — William D Coleman
*Assistant Examiner* — Su Kim

(57) ABSTRACT

High Efficiency Diode (HED) rectifiers with improved performance including reduced reverse leakage current, reliable solderability properties, and higher manufacturing yields are fabricated by minimizing topography variation at various stages of fabrication. Variations in the topography are minimized by using a CMP process to planarize the HED rectifier after the field oxide, polysilicon and/or solderable top metal are formed.

19 Claims, 14 Drawing Sheets

U.S. PATENT DOCUMENTS

| | | | |
|---|---|---|---|
| 4,621,414 A | 11/1986 | Iranmanesh | |
| 4,636,281 A | 1/1987 | Buiguez et al. | |
| 4,638,344 A | 1/1987 | Cardwell, Jr. | |
| 4,639,761 A | 1/1987 | Singer et al. | |
| 4,641,174 A | 2/1987 | Baliga | |
| 4,666,556 A | 5/1987 | Fulton et al. | |
| 4,698,653 A | 10/1987 | Cardwell, Jr. | |
| 4,716,126 A | 12/1987 | Cogan | |
| 4,745,079 A | 5/1988 | Pfiester | |
| 4,746,630 A | 5/1988 | Hui et al. | |
| 4,754,310 A | 6/1988 | Coe | |
| 4,767,722 A | 8/1988 | Blanchard | |
| 4,774,556 A | 9/1988 | Fujii et al. | |
| 4,801,986 A | 1/1989 | Chang et al. | |
| 4,821,095 A | 4/1989 | Temple | |
| 4,823,176 A | 4/1989 | Baliga et al. | |
| 4,824,793 A | 4/1989 | Richardson et al. | |
| 4,833,516 A | 5/1989 | Hwang et al. | |
| 4,853,345 A | 8/1989 | Himelick | |
| 4,868,624 A | 9/1989 | Grung et al. | |
| 4,893,160 A | 1/1990 | Blanchard | |
| 4,914,058 A | 4/1990 | Blanchard | |
| 4,941,026 A | 7/1990 | Temple | |
| 4,961,100 A | 10/1990 | Baliga et al. | |
| 4,967,245 A | 10/1990 | Cogan et al. | |
| 4,969,028 A | 11/1990 | Baliga | |
| 4,974,059 A | 11/1990 | Kinzer | |
| 4,975,782 A | 12/1990 | Bauer | |
| 4,979,004 A | 12/1990 | Esquivel et al. | |
| 4,990,463 A | 2/1991 | Mori | |
| 4,992,390 A | 2/1991 | Chang | |
| 5,027,180 A | 6/1991 | Nishizawa et al. | |
| 5,032,888 A | 7/1991 | Seki | |
| 5,034,785 A | 7/1991 | Blanchard | |
| 5,065,273 A | 11/1991 | Rajeevakumar | |
| 5,071,782 A | 12/1991 | Mori | |
| 5,072,266 A | 12/1991 | Bulucea et al. | |
| 5,079,608 A | 1/1992 | Wodarczyk et al. | |
| 5,105,243 A | 4/1992 | Nakagawa et al. | |
| 5,111,253 A | 5/1992 | Korman et al. | |
| 5,134,448 A | 7/1992 | Johnsen et al. | |
| 5,142,640 A | 8/1992 | Iwamatsu | |
| 5,155,059 A | 10/1992 | Hieda | |
| 5,156,989 A | 10/1992 | Williams et al. | |
| 5,164,325 A | 11/1992 | Cogan et al. | |
| 5,164,802 A | 11/1992 | Jones et al. | |
| 5,168,331 A | 12/1992 | Yilmaz et al. | |
| 5,188,973 A | 2/1993 | Omura et al. | |
| 5,208,657 A | 5/1993 | Chatterjee et al. | |
| 5,216,275 A | 6/1993 | Chen | |
| 5,219,777 A | 6/1993 | Kang | |
| 5,219,793 A | 6/1993 | Cooper et al. | |
| 5,233,215 A | 8/1993 | Baliga | |
| 5,241,195 A | 8/1993 | Tu et al. | |
| 5,242,845 A | 9/1993 | Baba et al. | |
| 5,250,450 A | 10/1993 | Lee et al. | |
| 5,262,336 A | 11/1993 | Pike, Jr. et al. | |
| 5,268,311 A | 12/1993 | Euen et al. | |
| 5,275,961 A | 1/1994 | Smayling et al. | |
| 5,275,965 A | 1/1994 | Manning | |
| 5,281,548 A | 1/1994 | Prall | |
| 5,283,201 A | 2/1994 | Tsang et al. | |
| 5,294,824 A | 3/1994 | Okada | |
| 5,298,781 A | 3/1994 | Cogan et al. | |
| 5,300,447 A | 4/1994 | Anderson | |
| 5,300,452 A | 4/1994 | Chang et al. | |
| 5,326,711 A | 7/1994 | Malhi | |
| 5,346,834 A | 9/1994 | Hisamoto et al. | |
| 5,350,937 A | 9/1994 | Yamazaki et al. | |
| 5,363,327 A | 11/1994 | Henkles et al. | |
| 5,365,102 A | 11/1994 | Mehrotra et al. | |
| 5,366,914 A | 11/1994 | Takahashi et al. | |
| 5,389,815 A | 2/1995 | Takahashi | |
| 5,405,794 A | 4/1995 | Kim | |
| 5,418,376 A | 5/1995 | Muraoka et al. | |
| 5,424,231 A | 6/1995 | Yang | |
| 5,429,977 A | 7/1995 | Lu et al. | |
| 5,430,311 A | 7/1995 | Murakami et al. | |
| 5,430,324 A | 7/1995 | Bencuya | |
| 5,434,435 A | 7/1995 | Baliga | |
| 5,436,189 A | 7/1995 | Beasom | |
| 5,438,007 A | 8/1995 | Vinal et al. | |
| 5,438,215 A | 8/1995 | Tihanyi | |
| 5,442,214 A | 8/1995 | Yang | |
| 5,473,176 A | 12/1995 | Kakumoto | |
| 5,473,180 A | 12/1995 | Ludikhuize | |
| 5,474,943 A | 12/1995 | Hshieh et al. | |
| 5,488,010 A | 1/1996 | Wong | |
| 5,519,245 A | 5/1996 | Tokura et al. | |
| 5,532,179 A | 7/1996 | Chang et al. | |
| 5,541,425 A | 7/1996 | Nishihara | |
| 5,554,552 A | 9/1996 | Chi | |
| 5,554,862 A | 9/1996 | Omura et al. | |
| 5,567,634 A | 10/1996 | Hebert et al. | |
| 5,567,635 A | 10/1996 | Acovic et al. | |
| 5,572,048 A | 11/1996 | Sugawara | |
| 5,576,245 A | 11/1996 | Cogan et al. | |
| 5,578,851 A | 11/1996 | Hshieh et al. | |
| 5,583,065 A | 12/1996 | Miwa | |
| 5,592,005 A | 1/1997 | Floyd et al. | |
| 5,593,909 A | 1/1997 | Han et al. | |
| 5,595,927 A | 1/1997 | Chen et al. | |
| 5,597,765 A | 1/1997 | Yilmaz et al. | |
| 5,605,852 A | 2/1997 | Bencuya | |
| 5,616,945 A | 4/1997 | Williams | |
| 5,623,152 A | 4/1997 | Majumdar et al. | |
| 5,629,543 A | 5/1997 | Hshieh et al. | |
| 5,637,898 A | 6/1997 | Baliga | |
| 5,639,676 A | 6/1997 | Hshieh et al. | |
| 5,640,034 A | 6/1997 | Malhi | |
| 5,648,670 A | 7/1997 | Blanchard | |
| 5,656,843 A | 8/1997 | Goodyear et al. | |
| 5,665,619 A | 9/1997 | Kwan et al. | |
| 5,668,394 A | 9/1997 | Lur et al. | |
| 5,670,803 A | 9/1997 | Beilstein, Jr. et al. | |
| 5,679,966 A | 10/1997 | Baliga et al. | |
| 5,684,320 A | 11/1997 | Kawashima | |
| 5,691,553 A | 11/1997 | Mori et al. | |
| 5,693,569 A | 12/1997 | Ueno | |
| 5,705,409 A | 1/1998 | Witek | |
| 5,710,072 A | 1/1998 | Krautschneider et al. | |
| 5,714,781 A | 2/1998 | Yamamoto et al. | |
| 5,719,409 A | 2/1998 | Singh et al. | |
| 5,723,891 A | 3/1998 | Malhi | |
| 5,731,626 A | 3/1998 | Eaglesham et al. | |
| 5,744,372 A | 4/1998 | Bulucea | |
| 5,767,004 A | 6/1998 | Balasubramanian et al. | |
| 5,770,878 A | 6/1998 | Beasom | |
| 5,773,851 A | 6/1998 | Nakamura et al. | |
| 5,776,813 A | 7/1998 | Huang et al. | |
| 5,780,343 A | 7/1998 | Bashir | |
| 5,801,417 A | 9/1998 | Tsang | |
| 5,814,858 A | 9/1998 | Williams | |
| 5,821,583 A | 10/1998 | Hshieh et al. | |
| 5,856,692 A | 1/1999 | Williams et al. | |
| 5,877,528 A | 3/1999 | So | |
| 5,879,971 A | 3/1999 | Witek | |
| 5,879,994 A | 3/1999 | Kwan et al. | |
| 5,894,157 A | 4/1999 | Han et al. | |
| 5,895,951 A | 4/1999 | So et al. | |
| 5,895,952 A | 4/1999 | Darwish et al. | |
| 5,897,343 A | 4/1999 | Mathew et al. | |
| 5,897,360 A | 4/1999 | Kawaguchi | |
| 5,900,663 A | 5/1999 | Johnson et al. | |
| 5,906,680 A | 5/1999 | Meyerson | |
| 5,907,776 A | 5/1999 | Hshieh et al. | |
| 5,917,216 A | 6/1999 | Floyd et al. | |
| 5,929,481 A | 7/1999 | Hshieh et al. | |
| 5,943,581 A | 8/1999 | Lu et al. | |
| 5,949,104 A | 9/1999 | D'Anna et al. | |
| 5,949,124 A | 9/1999 | Hadizad et al. | |
| 5,959,324 A | 9/1999 | Kohyama | |
| 5,960,271 A | 9/1999 | Wollesen et al. | |
| 5,972,741 A | 10/1999 | Kubo et al. | |
| 5,973,360 A | 10/1999 | Tihanyi | |
| 5,973,367 A | 10/1999 | Williams | |
| 5,976,936 A | 11/1999 | Miyajima et al. | |

| | | | | | | |
|---|---|---|---|---|---|---|
| 5,981,344 | A | 11/1999 | Hshieh et al. | 6,294,818 B1 | 9/2001 | Fujihira |
| 5,981,996 | A | 11/1999 | Fujishima | 6,297,534 B1 | 10/2001 | Kawaguchi et al. |
| 5,998,833 | A | 12/1999 | Baliga | 6,303,969 B1 | 10/2001 | Tan |
| 6,005,271 | A | 12/1999 | Hshieh | 6,307,246 B1 | 10/2001 | Nitta et al. |
| 6,008,097 | A | 12/1999 | Yoon et al. | 6,309,920 B1 | 10/2001 | Laska et al. |
| 6,011,298 | A | 1/2000 | Blanchard | 6,313,482 B1 | 11/2001 | Baliga |
| 6,015,727 | A | 1/2000 | Wanlass | 6,316,806 B1 | 11/2001 | Mo |
| 6,020,250 | A | 2/2000 | Kenney | 6,326,656 B1 | 12/2001 | Tihanyi |
| 6,034,415 | A | 3/2000 | Johnson et al. | 6,337,499 B1 | 1/2002 | Werner |
| 6,037,202 | A | 3/2000 | Witek | 6,346,464 B1 | 2/2002 | Takeda et al. |
| 6,037,268 | A | 3/2000 | Huang | 6,346,469 B1 | 2/2002 | Greer |
| 6,037,628 | A | 3/2000 | Huang | 6,351,018 B1 | 2/2002 | Sapp |
| 6,037,632 | A | 3/2000 | Omura et al. | 6,353,252 B1 | 3/2002 | Yasuhara et al. |
| 6,040,600 | A | 3/2000 | Uenishi et al. | 6,359,308 B1 | 3/2002 | Hijzen et al. |
| 6,048,772 | A | 4/2000 | D'Anna | 6,362,112 B1 | 3/2002 | Hamerski |
| 6,049,108 | A | 4/2000 | Williams et al. | 6,362,505 B1 | 3/2002 | Tihanyi |
| 6,051,488 | A | 4/2000 | Lee et al. | 6,365,462 B2 | 4/2002 | Baliga |
| 6,057,558 | A | 5/2000 | Yamamoto et al. | 6,365,930 B1 | 4/2002 | Schillaci et al. |
| 6,063,678 | A | 5/2000 | D'Anna | 6,368,920 B1 | 4/2002 | Beasom |
| 6,064,088 | A | 5/2000 | D'Anna | 6,368,921 B1 | 4/2002 | Hijzen et al. |
| 6,066,878 | A | 5/2000 | Neilson | 6,376,314 B1 | 4/2002 | Jerred |
| 6,069,043 | A | 5/2000 | Floyd et al. | 6,376,315 B1 | 4/2002 | Hshieh et al. |
| 6,077,733 | A | 6/2000 | Chen et al. | 6,376,878 B1 | 4/2002 | Kocon |
| 6,078,090 | A | 6/2000 | Williams et al. | 6,376,890 B1 | 4/2002 | Tihanyi |
| 6,081,009 | A | 6/2000 | Neilson | 6,384,456 B1 | 5/2002 | Tihanyi |
| 6,084,264 | A | 7/2000 | Darwish | 6,388,286 B1 | 5/2002 | Baliga |
| 6,084,268 | A | 7/2000 | de Fresart et al. | 6,388,287 B2 | 5/2002 | Deboy et al. |
| 6,087,232 | A | 7/2000 | Kim et al. | 6,400,003 B1 | 6/2002 | Huang |
| 6,096,608 | A | 8/2000 | Williams | 6,429,481 B1 | 8/2002 | Mo et al. |
| 6,097,063 | A | 8/2000 | Fujihira | 6,433,385 B1 | 8/2002 | Kocon et al. |
| 6,103,578 | A | 8/2000 | Uenishi et al. | 6,436,779 B2 | 8/2002 | Hurkx et al. |
| 6,103,619 | A | 8/2000 | Lai | 6,437,399 B1 | 8/2002 | Huang |
| 6,104,054 | A | 8/2000 | Corsi et al. | 6,441,454 B2 | 8/2002 | Hijzen et al. |
| 6,110,799 | A | 8/2000 | Huang | 6,444,574 B1 | 9/2002 | Chu |
| 6,114,727 | A | 9/2000 | Ogura et al. | 6,452,230 B1 | 9/2002 | Boden, Jr. |
| 6,137,152 | A | 10/2000 | Wu | 6,461,918 B1 | 10/2002 | Calafut |
| 6,144,054 | A | 11/2000 | Agahi et al. | 6,465,304 B1 | 10/2002 | Blanchard et al. |
| 6,150,697 | A | 11/2000 | Teshigahara et al. | 6,465,843 B1 | 10/2002 | Hirler et al. |
| 6,153,920 | A | 11/2000 | Gossmann et al. | 6,465,869 B2 | 10/2002 | Ahlers et al. |
| 6,156,606 | A | 12/2000 | Michaelis | 6,472,678 B1 | 10/2002 | Hshieh et al. |
| 6,156,611 | A | 12/2000 | Lan et al. | 6,472,708 B1 | 10/2002 | Hshieh et al. |
| 6,163,052 | A | 12/2000 | Liu et al. | 6,475,884 B2 | 11/2002 | Hshieh et al. |
| 6,165,870 | A | 12/2000 | Shim et al. | 6,476,443 B1 | 11/2002 | Kinzer |
| 6,168,983 | B1 | 1/2001 | Rumennik et al. | 6,479,352 B2 | 11/2002 | Blanchard |
| 6,168,996 | B1 | 1/2001 | Numazawa et al. | 6,489,652 B1 | 12/2002 | Jeon et al. |
| 6,171,935 | B1 | 1/2001 | Nance et al. | 6,498,061 B2 | 12/2002 | Divakaruni et al. |
| 6,174,769 | B1 | 1/2001 | Lou | 6,501,129 B2 | 12/2002 | Osawa |
| 6,174,773 | B1 | 1/2001 | Fujishima | 6,501,146 B1 | 12/2002 | Harada |
| 6,174,785 | B1 | 1/2001 | Parekh et al. | 6,534,825 B2 | 3/2003 | Calafut |
| 6,184,545 | B1 | 2/2001 | Werner et al. | 6,566,804 B1 | 5/2003 | Trujillo et al. |
| 6,184,555 | B1 | 2/2001 | Tihanyi et al. | 6,580,123 B2 | 6/2003 | Thapar |
| 6,188,104 | B1 | 2/2001 | Choi et al. | 6,593,620 B1 | 7/2003 | Hshieh et al. |
| 6,188,105 | B1 | 2/2001 | Kocon et al. | 6,608,350 B2 | 8/2003 | Kinzer et al. |
| 6,190,978 | B1 | 2/2001 | D'Anna | 6,621,121 B2 | 9/2003 | Baliga |
| 6,191,447 | B1 | 2/2001 | Baliga | 6,657,254 B2 | 12/2003 | Hshieh et al. |
| 6,194,741 | B1 | 2/2001 | Kinzer et al. | 6,667,515 B2 | 12/2003 | Inoue |
| 6,198,127 | B1 | 3/2001 | Kocon | 6,677,641 B2 | 1/2004 | Kocon |
| 6,201,279 | B1 | 3/2001 | Pfirsch | 6,683,346 B2 | 1/2004 | Zeng |
| 6,204,097 | B1 | 3/2001 | Shen et al. | 6,710,403 B2 | 3/2004 | Sapp |
| 6,207,994 | B1 | 3/2001 | Rumennik et al. | 6,720,616 B2 | 4/2004 | Hirler et al. |
| 6,222,229 | B1 | 4/2001 | Hebert et al. | 6,734,066 B2 | 5/2004 | Lin et al. |
| 6,222,233 | B1 | 4/2001 | D'Anna | 6,750,508 B2 | 6/2004 | Omura et al. |
| 6,225,649 | B1 | 5/2001 | Minato | 6,762,127 B2 | 7/2004 | Boiteux et al. |
| 6,228,727 | B1 | 5/2001 | Lim et al. | 6,780,714 B2 | 8/2004 | Gajda et al. |
| 6,236,099 | B1 | 5/2001 | Boden, Jr. | 6,806,533 B2 | 10/2004 | Henninger et al. |
| 6,239,463 | B1 | 5/2001 | Williams et al. | 6,833,584 B2 | 12/2004 | Henninger et al. |
| 6,239,464 | B1 | 5/2001 | Tsuchitani et al. | 6,838,722 B2 | 1/2005 | Bhalla et al. |
| 6,265,269 | B1 | 7/2001 | Chen et al. | 6,841,825 B2 | 1/2005 | Kurosaki et al. |
| 6,271,082 | B1 | 8/2001 | Hou et al. | 6,870,220 B2 | 3/2005 | Kocon et al. |
| 6,271,100 | B1 | 8/2001 | Ballantine et al. | 6,916,745 B2 | 7/2005 | Herrick et al. |
| 6,271,552 | B1 | 8/2001 | D'Anna | 6,936,890 B2 | 8/2005 | Hueting et al. |
| 6,271,562 | B1 | 8/2001 | Deboy et al. | 6,979,874 B2 | 12/2005 | Harada |
| 6,274,904 | B1 | 8/2001 | Tihanyi | 7,005,347 B1 * | 2/2006 | Bhalla et al. .................. 438/259 |
| 6,274,905 | B1 | 8/2001 | Mo | 7,180,152 B2 | 2/2007 | Herman |
| 6,277,706 | B1 | 8/2001 | Ishikawa | 7,345,342 B2 | 3/2008 | Challa et al. |
| 6,281,547 | B1 | 8/2001 | So et al. | 7,416,948 B2 | 8/2008 | Kraft et al. |
| 6,285,060 | B1 | 9/2001 | Korec et al. | 7,482,205 B2 | 1/2009 | Herman |
| 6,291,298 | B1 | 9/2001 | Williams et al. | 7,638,841 B2 | 12/2009 | Challa |
| 6,291,856 | B1 | 9/2001 | Miyasaka et al. | 7,652,326 B2 | 1/2010 | Kocon |

| | | | |
|---|---|---|---|
| 2001/0023961 A1 | 9/2001 | Hshieh et al. | |
| 2001/0026989 A1 | 10/2001 | Thapar | |
| 2001/0028083 A1 | 10/2001 | Onishi et al. | |
| 2001/0032998 A1 | 10/2001 | Iwamoto et al. | |
| 2001/0041400 A1 | 11/2001 | Ren et al. | |
| 2001/0049167 A1 | 12/2001 | Madson | |
| 2001/0050394 A1 | 12/2001 | Onishi et al. | |
| 2002/0008284 A1 | 1/2002 | Zeng | |
| 2002/0009832 A1 | 1/2002 | Blanchard | |
| 2002/0014658 A1 | 2/2002 | Blanchard | |
| 2002/0066924 A1 | 6/2002 | Blanchard | |
| 2002/0070418 A1 | 6/2002 | Kinzer et al. | |
| 2002/0100933 A1 | 8/2002 | Marchant | |
| 2002/0155685 A1 | 10/2002 | Sakakibara | |
| 2003/0006452 A1 | 1/2003 | Challa | |
| 2003/0060013 A1 | 3/2003 | Marchant | |
| 2003/0073287 A1 | 4/2003 | Kocon | |
| 2003/0132450 A1 | 7/2003 | Minato et al. | |
| 2003/0178676 A1 | 9/2003 | Henninger et al. | |
| 2003/0178678 A1 | 9/2003 | Wei et al. | |
| 2003/0193067 A1 | 10/2003 | Kim et al. | |
| 2003/0197220 A1 | 10/2003 | Disney | |
| 2003/0209757 A1 | 11/2003 | Henninger et al. | |
| 2004/0031987 A1 | 2/2004 | Henninger et al. | |
| 2004/0089910 A1 | 5/2004 | Hirler et al. | |
| 2004/0121572 A1 | 6/2004 | Darwish et al. | |
| 2004/0232407 A1 | 11/2004 | Calafut | |
| 2005/0009277 A1 | 1/2005 | Chuang et al. | |
| 2005/0017293 A1 | 1/2005 | Zundel et al. | |
| 2008/0135889 A1 | 6/2008 | Session | |
| 2008/0135931 A1 | 6/2008 | Challa et al. | |
| 2008/0138953 A1 | 6/2008 | Challa et al. | |
| 2008/0150020 A1 | 6/2008 | Challa et al. | |
| 2008/0169505 A1* | 7/2008 | Hsieh | 257/331 |
| 2008/0185730 A1* | 8/2008 | Lung | 257/774 |
| 2008/0197407 A1 | 8/2008 | Challa et al. | |
| 2008/0199997 A1 | 8/2008 | Grebs et al. | |
| 2009/0008706 A1 | 1/2009 | Yedinak et al. | |
| 2009/0008709 A1 | 1/2009 | Yedinak et al. | |
| 2009/0111227 A1* | 4/2009 | Kocon et al. | 438/259 |
| 2010/0084706 A1 | 4/2010 | Kocon | |

FOREIGN PATENT DOCUMENTS

| | | |
|---|---|---|
| DE | 4300806 C1 | 12/1993 |
| DE | 19736981 A1 | 8/1998 |
| EP | 0975024 A2 | 1/2000 |
| EP | 1026749 A1 | 8/2000 |
| EP | 1054451 A2 | 11/2000 |
| EP | 2003/1168455 A2 | 1/2002 |
| EP | 0747967 B1 | 2/2002 |
| EP | 1205980 A1 | 5/2002 |
| EP | 2003/1369927 A2 | 12/2003 |
| JP | 56-058267 A | 5/1981 |
| JP | 62-069562 | 5/1981 |
| JP | 63-186475 | 3/1987 |
| JP | 63-288047 | 8/1988 |
| JP | 63-224260 A | 9/1988 |
| JP | 64-059868 A | 3/1989 |
| JP | 01-192174 A | 8/1989 |
| JP | 03024765 A | 1/1991 |
| JP | 08186258 A | 7/1996 |
| JP | 08-264772 A | 10/1996 |
| JP | 64-022051 | 11/1998 |
| JP | 2000-012842 A | 1/2000 |
| JP | 2000-040822 | 2/2000 |
| JP | 2000-040872 | 2/2000 |
| JP | 2000-156978 A | 2/2000 |
| JP | 2000-277726 A | 10/2000 |
| JP | 2000-277728 | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 | 9/2001 |
| JP | 2002-083976 A | 3/2002 |
| TW | 224372 B | 11/2004 |
| WO | WO00/33386 A2 | 6/2000 |
| WO | WO00/42665 A1 | 7/2000 |
| WO | WO00/68997 A1 | 11/2000 |
| WO | WO00/68998 A1 | 11/2000 |
| WO | WO00/75965 A2 | 12/2000 |
| WO | WO01/06550 A1 | 1/2001 |
| WO | WO01/06557 A1 | 1/2001 |
| WO | WO01/45155 A1 | 6/2001 |
| WO | WO01/59847 A2 | 8/2001 |
| WO | WO01/71815 A2 | 9/2001 |
| WO | WO01/95385 A1 | 12/2001 |
| WO | WO01/95398 A1 | 12/2001 |
| WO | WO02/01644 A2 | 1/2002 |
| WO | WO02/47171 A1 | 6/2002 |
| WO | WO03/023861 A2 | 3/2003 |

OTHER PUBLICATIONS

"IR develops CoolMOS.TM.—equivalent technology, positions it at the top of a 3-tiered line of new products for SMPS," International Rectifiers company information available at http://irf.com (1999), 3 pages total.

Bai et al., "Novel automated optimization of power MOSFET for 12V input, high-frequency DC-DC converter," International Symposium on Power Semiconductors and ICs, Technical Digest, (2003), pp. 366-369.

Baliga "New Concepts in Power Rectifiers," Physics of Semiconductor Devices, Proceedings of the Third Int'l Workshop, Madras (India), Committee on Science and Technology in Developing Countries(1985). pp. 471-481.

Baliga "Options for CVD of Dielectrics Include Low-k Materials," Technical Literature from Semiconductor International Jun. 1998., 4 pages total.

Baliga et al., "Improving the reverse recovery of power MOSFET integral diodes by electron irradiation," (Dec. 1983) Solid State Electronics, vol. 26, No. 12, pp. 1133-1141.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology for High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1m.OMEGA. cm.sup.2," IEEE Transactions on Electron Devices 34:2329-2333 (1987).

Cheng et al. , "Fast reverset recovery body diodie in high-voltage VDMOSFET using cell-dsistributed Schottky contacts," (May 2003) IEEE Transactions on ELectron Devices, vol. 50. No. 5, pp. 1422-1425.

Curtis et al. "APCVD TEOS: 03 Advanced Trench Isolation Applications," Semiconductor Fabtech 9th Edition (1999) 8 pages total.

Darwish et al. A New Power W-Gated Trench MOSFET (WMOSDET) with High Switching Performance. ISPSD Proceedings—Apr. 2003, Cambridge, 4 pages total.

Djekic, O. et al., "High frequency synchronous buck converter for low voltage applications," (1998) Proc. IEEE Power Electronics Specialist Conf. (PESC), pp. 1248-1254.

Fujihara "Theory of Semiconductor Superjunction Devices" Jpn. J. Appl. Phys. vol. 36 pp. 6254-6252 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada, 4 pages total.

Glenn et al. "A Novel Vertical Deep Trench Resurf DMOS (VTR-DMOS)" IEEE ISPD 2000, May 22-25, Toulouse France, pp. 197-200.

Kao et al. "Two Dimensional Thermal Oxidation of Silicon-I. Experiments " *IEEE Transactions on Electron Devices*, vol. ED-34, No. 5, May 1987, pp. 1008-1017.

Kao et al. "Two Dimensional Thermal Oxidation of Silicon-II. Modeling Stress Effects in Wet Oxides,", *IEEE Transactions on Electron Devices*, vol. ED-35, No. 1, Jan. 1988, pp. 25-37.

Kassakian, J.G. et al., "High-frequency high-density converters for distributed power supply systems," (Apr. 1988) Proceedings of the IEEE, vol. 76, No. 4, pp. 362-376.

Korman, C.S. et al., "High performance power DMOSFET with integrated schottky diode," (1989) Proc. IEEE Power Electronics Specialist Conf. (PESC), pp. 176-179.

Lorenz et al. "Cool MOS—An important milestone towards a new Power MOSFET generation" power Conversion pp. 151-160 (1988).

Maksimovic, A.M. et al., "Modeling and simulation of power electronic converters," (Jun. 2001) Proceedings of the IEEE, vol. 89, No. 6, pp. 898-912.

Mehrotra, M. et al., "Very low forward drop JBS rectifiers fabricated using submicron technology," (Nov. 1993) IEEE Transactions on Electron Devices, vol. 40, No. 11, pp. 2131-2132.

Miller, "Power Management & Supply—Market, Applications Technologies—an Overview," Infineon Technologies, downloaded from the internet <<http://www.ewh.ieee.org/r8/germany/ias-pels/m_regensburg/overview_miller.pdf>>, May 5, 2003, 53 pages total.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria, (2002). pp. 283-285.

Sakai et al., "Experimental investigation of dependence of electrical characteristics of device parameters in trench MOS barrier, schottky diodes," (1998) International Symposium on Power Semiconductors and ICs, Technical Digest, pp. 293-296.

Shenai et al., "Current transport mechanisms in atomically abrupt metal-semiconductor interfaces," (Apr. 1988) IEEE Transactions on Electron Devices, vol. 35, No. 4, pp. 468-482.

Shenai et al., "Monolithically integrated power MOSFET and schottky diode with improved reverse recovery characteristics," (Apr. 1990) IEEE Transactions on Electron Devices, vol. 37, No. 4, pp. 1167-1169.

Shenoy et al. "Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) Proc. IEEE Power Electronics Specialist Conf. (PESC), pp. 769-779.

Technical Literature from Quester Technology, Model APT-4300 300 mm Atmospheric TEOS/Ozone CVD System, ( unknown date), 3 pages total.

Technical Literature from Quester Technology, Model APT-6000 Atmospheric TEOS-Ozone CVD System, (unknown date), 2 pages total.

Technical Literature from Silicon Valley Thermal Systems, APNext, High Throughput APCVD Cluster Tool for 200 mm/300 mm Wafer Processing, unknown date.

Tu et al. "On the reverse blocking characteristics of schottky power diodes," (Dec. 1992) IEEE Transactions on Electron Devices, vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski et al. "Schottky Diodes with High Breakdown Voltages," Solid-State Electronics 26:491-493 (1983).

Wolf "Silicon Processing for the VLSI Era" vol. 2 Process Integration Lattice Press (1990), 3 pages total.

Wolf et al., "Silicon Processing for the VLSI Era" vol. 1—Process Technology, Second Edition, (1990), pp. 658.

Yamashita et al., Conduction Power loss in MOSFET synchronous rectifier with parallel-connected schottky barrier diode, (Jul. 1998) IEEE Transactions on Power electronics, vol. 13, No. 4, pp. 667-673.

Yang, et al.; "Tunable Oxide-Bypassed Trench Gate MOSFET: Breaking the Ideal Superjunction MOSFET Performance Line at Equal Column Width;" IEEE Electron Device Letters; Nov. 2003; pp. 704-706; vol. 24; No. 11.

Office action for U.S. Appl. No. 12/039,011 (Apr. 23, 2012).
Notice of Allowance for U.S. Appl. No. 12/636,011 (Mar. 22, 2012).
Office action for U.S. Appl. No. 12/819,023 (Feb. 15, 2012).
Notice of Allowance for U.S. Appl. No. 12/636,011, mailed on Mar. 22, 2012, 5 pages.
Non-Final Office Action received for U.S. Appl. No. 12/039,011, mailed on Apr. 23, 2012, 13 pages.
Non-Final Office Action received for U.S. Appl. No. 12/819,023, mailed on Jul. 30, 2012, 13 pages.
Notice of Allowance for U.S. Appl. No. 12/636,011, mailed on Aug. 3, 2012, 5 pages.

* cited by examiner

TRENCH MOS BARRIER SCHOTTKY RECTIFIER WITH A PLANAR SURFACE USING CMP TECHNIQUES

CROSS-REFERENCE TO RELATED APPLICATIONS

This application is a continuation of U.S. application Ser. No. 12/819,023, filed Jun. 18, 2010, which is incorporated herein by reference in its entirety for all purposes.

BACKGROUND

The present invention relates to semiconductor power device technology and more particularly to improved trench MOS (metal oxide semiconductor) barrier Schottky rectifiers with planar surfaces and fabrication processes for forming the same.

Trench MOS barrier Schottky (TMBS) rectifiers are Schottky diodes that have been integrated with trench gate shielding structures (e.g., TMBS rectifiers or monolithically integrated trench gate FET and Schottky diode devices). An integrated TMBS, which typically includes a Schottky diode array that has been interspersed between MOS trenches, generally comprises a mesa structure formed in a semiconductor epitaxial layer of a semiconductor substrate. The mesa is defined by the region between one or more trenches, which are disposed in the epitaxial layer. In TMBS devices, charge coupling between majority charge carriers in a mesa disposed between trenches in the epitaxial/drift region and conductors on the sidewalls of the trenches changes the electric field profile under the Schottky contact which reduces reverse leakage current and improves breakdown properties.

Existing techniques used to fabricate TMBS rectifiers produce topographies between device structures. For example, in an active array the tops of the polysilicon gates, silicon mesa and field dielectric are irregular and not substantially flat. This irregular topography can include abrupt changes which can significantly affect device performance by increasing reverse leakage current. Further, topographies which are created between the polysilicon gates and the mesa regions or the field dielectric to the active array propagate to layers that are subsequently formed on top of the polysilicon gates and mesa regions or the field dielectric and active array. These topographies propagate to the top surfaces of the TMBS rectifiers which end up having similar topographies. The top surfaces of the TMBS rectifier can include layers such as nitride layers and solderable top metal (STM) layers which are prone to developing cracks when they have substantially non-planar topographies. The cracks that develop in the nitride and STM layers on the top of the TMBS rectifiers can propagate to the bottom part of the nitride and STM layers and reach the metal pad layer. These cracks can then increase the reverse leakage current in the TMBS rectifier which make the TMBS rectifier inoperable or reduce its performance.

These topographies can also reduce the effectiveness of solder connections made with the STM to the package. The topographies can reduce the integrity of the solder connection because the non-coplanar surface on the STM layer on top of the TMBS rectifier is not as conducive to soldering as a planar surface. Since these topographies reduce the integrity of the solder connection, the topographies also reduce the reliability of the TMBS rectifier because the solder connections on the STM surface having non-coplanar topography are not as reliable.

Further, variations in topographies which are created between the polysilicon gates and mesa can increase the chances of inducing plasma damage to the structure (shield dielectric). The damage is caused by plasma etching the polysilicon gates, which has a non-planar surface between the polysilicon and mesa regions. This plasma induced damage can further damage the TMBS rectifier while it is being fabricated. The non-uniform topographies can increase the chances of damage occurring during processes such as plasma etching. Non-uniform contours can cause charge build up during processes such as etching which can cause arcing and damage to the TMBS rectifier as it is being fabricated. Damages that occur during fabrication can reduce yields which can increase the cost of manufacturing TMBS rectifiers. Variations in the topography can also make it difficult to uniformly deposit onto or etch material from the surface. For example, variations in topography make it difficult to bring the entire surface of the substrate in the depth of field of photolithography systems, or selectively remove material based on position. These variations that occur during fabrication can lead to variations in the electrical performance of the TMBS rectifier.

Therefore, there is a need for cost effective fabrication processes and substrate structures that reduce variations in the topography surface between termination and active cells and assists in reducing reverse leakage current and improves solderability properties.

SUMMARY

Embodiments of the present invention provide techniques for fabricating High Efficiency Diode (HED) rectifiers that reduce variations in the topography surface between termination and active cells and assists in reducing reverse leakage current and improves solderability properties. Embodiments of the invention also provide embodiments of HED rectifiers structures made using these techniques.

In one embodiment, a method of forming a semiconductor device includes forming a field oxide region in an epitaxial layer, forming a plurality of trenches that have sidewalls and a bottom in the epitaxial layer separated by mesas, forming a shield dielectric that lines the sidewalls and bottom of the trenches and substantially covers the mesas and field oxide region, depositing polysilicon to substantially fill the plurality of trenches and substantially cover the shield dielectric, and planarizing the polysilicon using chemical mechanical planarization (CMP) to generate a substantially planar surface including substantially planar regions of polysilicon, shield dielectric, and mesa regions. The field oxide region extends into the epitaxial layer and above the epitaxial layer. The regions of polysilicon, shield dielectric and mesa regions can be formed by planarization to form a substantially flat contiguous surface.

In another embodiment, the method further includes forming a top metal layer, a dielectric layer, and a solderable top metal (STM) layer over the top metal. The tops of the dielectric layer and the STM layer are substantially coplanar. The top metal can include a Schottky contact. The top metal can be formed over a portion of a NiSi layer and over a portion of the shield dielectric layer deposited on the field oxide layer. The dielectric layer can include polyimide. The dielectric layer can also be selected from the group consisting of polyimide and deposited silicon nitride, polyimide and deposited silicon dioxide, polyimide and deposited silicon oxy-nitride, silicon nitride, silicon oxy-nitride, and silicon dioxide. A portion of the dielectric layer can be a street which is used to separate the semiconductor devices made on a single wafer.

In another embodiment of the method, forming the STM metal includes depositing Ti/NiV/Ag or Ta/Cu over the top metal.

In another embodiment, a second method of forming a semiconductor device includes forming a field oxide in an epitaxial layer, planarizing the field oxide using chemical mechanical planarization (CMP) to generate a substantially planar surface that includes substantially planar regions of field oxide and epitaxial layer, forming a plurality of trenches that have sidewalls and a bottom in the epitaxial layer separated by mesas, forming a shield dielectric that lines the sidewalls and bottom of the trenches and substantially covers the mesas and field oxide region, and depositing polysilicon to substantially fill the plurality of trenches and substantially cover the shield dielectric. The field oxide extends into the epitaxial layer and above the epitaxial layer. The polysilicon can be planarized using chemical mechanical planarization (CMP) to generate a substantially planar surface that includes substantially planar regions of polysilicon, shield dielectric, and mesas.

In yet another embodiment of the second method, forming the field oxide includes forming a pad oxide layer over a substrate, forming a nitride layer over the pad oxide layer, etching the pad oxide layer and nitride layer according to a pattern, gowning the field oxide in the pattern and recessed into the substrate, and removing the pad oxide layer and nitride layer from active areas.

In another embodiment, a third method of forming a semiconductor device includes forming a field oxide in an epitaxial layer, forming a plurality of trenches that have sidewalls and a bottom in the epitaxial layer separated by mesas, forming a shield dielectric that lines the sidewalls and bottom of the trenches and substantially covers the mesas and field oxide region, depositing polysilicon to substantially fill the plurality of trenches and substantially cover the shield dielectric, forming a top metal over the polysilicon and over a portion of the shield dielectric layer, forming a dielectric layer over a first portion of the top metal, forming a solderable top metal (STM) layer over a second portion of the top metal, and planarizing the STM layer using chemical mechanical planarization (CMP) to generate a substantially planar surface that includes substantially planar regions of the STM material and dielectric material. The field oxide extends into the epitaxial layer and above the epitaxial layer. The dielectric layer can include polyimide.

In yet another embodiment, the third method further includes planarizing the field oxide using chemical mechanical planarization (CMP) to generate a substantially planar surface including substantially planar regions of field oxide and epitaxial layer.

In yet another embodiment, the third method further includes planarizing the polysilicon using chemical mechanical planarization (CMP) to generate a substantially planar surface including substantially planar regions of polysilicon, shield dielectric and mesas.

In yet another embodiment, the third method further includes planarizing the field oxide using chemical mechanical planarization (CMP) to generate a substantially planar surface including substantially planar regions of field oxide and epitaxial layer, and planarizing the polysilicon using chemical mechanical planarization (CMP) to generate a substantially planar surface including substantially planar regions of polysilicon, shield dielectric and mesas.

In yet another embodiment, the third method further includes forming a nickel silicide (NiSi) layer over the plurality of trenches. The top metal can be formed over a portion of the NiSi layer and over a portion of the shield dielectric layer deposited on the field oxide layer.

In another embodiment, a semiconductor device includes an epitaxial layer, a field oxide region disposed in the epitaxial layer, a plurality of trenches that include sidewalls and a bottom disposed in the epitaxial layer, the plurality of trenches are separated by a plurality of mesas, a shield dielectric that lines the trench sidewalls and bottom of the trenches and covers the field oxide region, a polysilicon that substantially fills the plurality of trenches, and a substantially planar surface that includes substantially planar regions of polysilicon, shield dielectric and mesas. The substantially planar surface can be formed using chemical mechanical planarization (CMP). The field oxide extends into the epitaxial layer. The substantially planar surface can be contiguous with polysilicon, shield dielectric and mesas.

In yet another embodiment, the semiconductor device further includes a top metal, a dielectric layer and a solderable top metal (STM) layer disposed over the top metal. The tops of the dielectric layer and the STM layer are substantially coplanar.

In another embodiment, a second semiconductor device includes an epitaxial layer, and a field oxide region disposed in the epitaxial layer. The field oxide extends into the epitaxial layer and forms a substantially planar first surface including substantially planar regions of field oxide and epitaxial layer, a plurality of trenches including sidewalls and a bottom disposed in the epitaxial layer, the plurality of trenches separated by a plurality of mesas, a shield dielectric that lines the trench sidewalls and bottom of the trenches and covers the field oxide region, and a polysilicon that substantially fills the plurality of trenches. The first surface can be formed using chemical mechanical planarization (CMP). The top surface of the field oxide and the top surface of the epitaxial layer can form a contiguous surface.

In yet another embodiment, the second semiconductor device further includes a substantially planar second surface including substantially planar regions of polysilicon, shield dielectric and mesas, the second surface is formed using CMP.

In another embodiment, a third semiconductor device includes an epitaxial layer, a field oxide region disposed in the epitaxial layer, a plurality of trenches including sidewalls and a bottom disposed in the epitaxial layer, a shield dielectric that lines the trench sidewalls and bottom of the trenches and covers the field oxide region, a polysilicon that substantially fills the plurality of trenches, a top metal that covers a portion of the shield dielectric layer, a dielectric layer that covers a first portion of the top metal, a solderable top metal (STM) layer disposed adjacent to the dielectric layer and covering a second portion of the top metal, and a substantially planar first surface that includes substantially planar regions of the STM material and dielectric material. The substantially planar first surface can be formed using chemical mechanical planarization (CMP). The field oxide extends into the epitaxial layer. The plurality of trenches is separated by a plurality of mesas. The dielectric layer can be any dielectric materials such as polyimide, polymer dielectrics, know semiconductor dielectrics, or combinations thereof. For example, the dielectric layer can be selected from the group consisting of polyimide and deposited silicon nitride, polyimide and deposited silicon dioxide, polyimide and deposited silicon oxy-nitride, silicon nitride, silicon oxy-nitride, and silicon dioxide. The STM metal can include Ti/NiV/Ag or Ta/Cu.

In yet another embodiment, a third semiconductor device further includes a substantially planar second surface including substantially planar regions of field oxide and epitaxial layer, the substantially planar second surface formed using chemical mechanical planarization (CMP).

In yet another embodiment, a third semiconductor device further includes a substantially planar third surface including substantially planar regions of polysilicon, shield dielectric and mesas, the substantially planar third surface formed using chemical mechanical planarization (CMP).

In yet another embodiment, a third semiconductor device further includes a substantially planar second surface including substantially planar regions of field oxide and epitaxial layer, and a substantially planar third surface including substantially planar regions of polysilicon, shield dielectric and mesas. The substantially planar second surface is formed using chemical mechanical planarization (CMP). The substantially planar third surface is formed using chemical mechanical planarization (CMP).

The embodiments described above and herein are not the only embodiments of this invention. Features found in particular embodiments described herein can be combined with other embodiments described herein. Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

DETAILED DESCRIPTION

In the following description, for the purposes of explanation, specific details are set forth in order to provide a thorough understanding of the invention. However, it will be apparent that the invention may be practiced without these specific details.

Embodiments of the present invention provide HED rectifiers with improved performance including reduced reverse leakage current, reliable solderability properties, and higher manufacturing yields. The improved HED rectifier has a reduce topography variation across the surface between termination and active cells which assists in reducing reverse leakage current and significantly improves solderability depending on packaging methodology. The reverse leakage current is reduced by creating a planar surface between shield dielectric, polysilicon and mesas, prior to Schottky metallization. The reduced topography variation produces a more uniform surface across the device which eliminates plasma etch damage caused by traditional contact etch methods and improves the uniformity of layers within the device. A CMP process can also be used to keep the shield electrode and dielectric intact to reduce the electric field at the top corners of the cell structure. A low stress metallic Schottky contact region is formed with the mesa that is co-planar with the shield electrode and dielectric. A recessed field oxide is produced using a LOCal Oxidation of Silicon (LOCOS) process. A chemical mechanical planarization process can be used to form the termination dielectric which provides a planar surface from street to active area. The shield polysilicon electrode is processed using CMP to produce a planarized surface across the active cell structure (shield polysilicon, shield dielectric and active silicon mesa area). The solderable metal surface can also be processed using CMP to help planarize the solderable surface.

Figure 1:
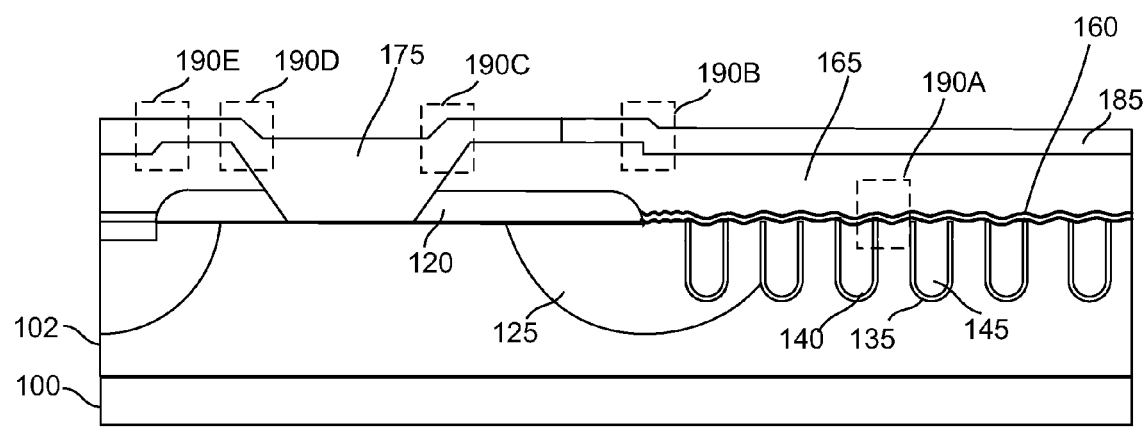
FIG. 1 illustrates a cross section of an HED rectifier with significant topography variations at the surface.

FIG. 1 illustrates a cross section of an HED rectifier with significant topography variations at the surface that are caused by height variations between the shield dielectric layer, polysilicon gates, and field oxide layers. The HED rectifier includes a substrate 100, an epitaxial layer 102, a field oxide region 120, an implant region 125, trenches 135 shield dielectric layer 140, polysilicon 145, a nickel silicide layer (NiSi) 160, a top metal 165, a nitride layer 175, a solderable top metal (STM) layer 185, and regions 190A-190E. Region 190A is a region showing the irregularity in the nickel silicide layer (NiSi) 160, which causes reverse leakage current. The irregularities shows in the region 190A are caused by height variations between the trenches 135 and the mesas between the trenches 135. Regions 190B-190E are regions where the nitride layer 175 is prone to cracking because of the topography of the nitride layer 175 in these regions. The variations in topography on the nitride layer 175 at the surface of the HED rectifier, which are illustrated in regions 190A-190E, originated because of height variations between the field oxide layers 120, shield dielectric layer 140, and polysilicon 145 gates. These height variations between the field oxide layers 120, shield dielectric layer 140, and polysilicon 145 gates are propagated when a layer is deposited on top of these layers until the variations are manifested on the surface of the HED rectifier.

Because of its topography, region 190A can cause significant reverse leakage current in the HED rectifier, which can reduce its performance or render it inoperable. In one embodiment, the field oxide region 120 is planarized using a CMP process to generate a substantially planar surface having substantially planar regions at the top of the trenches with field oxide and epitaxial layer, which significantly reduces reverse leakage current. Further details of this CMP process are discussed with reference to FIGS. 3-10 below.

Also, because of its topography the other regions 190B-190E can develop a primary crack that can propagate to the bottom part of the nitride 175, which can increase the reverse leakage current in the HED rectifier reducing its performance or rendering it inoperable. The chances of this primary crack developing can be significantly reduced by reducing the variation in topography in region 190A. The chances of this primary crack developing can also be significantly reduced by reducing the variation in topography in regions 190B-190E. In one embodiment the variation in topography in regions 190B-190E is reduced by using CMP to planarize the field oxide layers 120, shield dielectric layer 140, and polysilicon 145 gates. Once these layers are planarized, their height variation will be significantly reduced and therefore will not propagate and manifest itself on the surface of the HED rectifier. Further details of this CMP process are discussed with reference to FIGS. 3-10 below. In another embodiment the variation in topography is reduced by using polyimide instead of nitride in layer 175, as is also discussed in further detail with reference to FIGS. 3-10 below. As an alternative to using polyimide, the following compounds can also be used: polyimide and deposited silicon nitride, polyimide and deposited silicon dioxide, polyimide and deposited silicon oxy-nitride, silicon nitride, silicon oxy-nitride, and silicon dioxide.

Figure 2A:
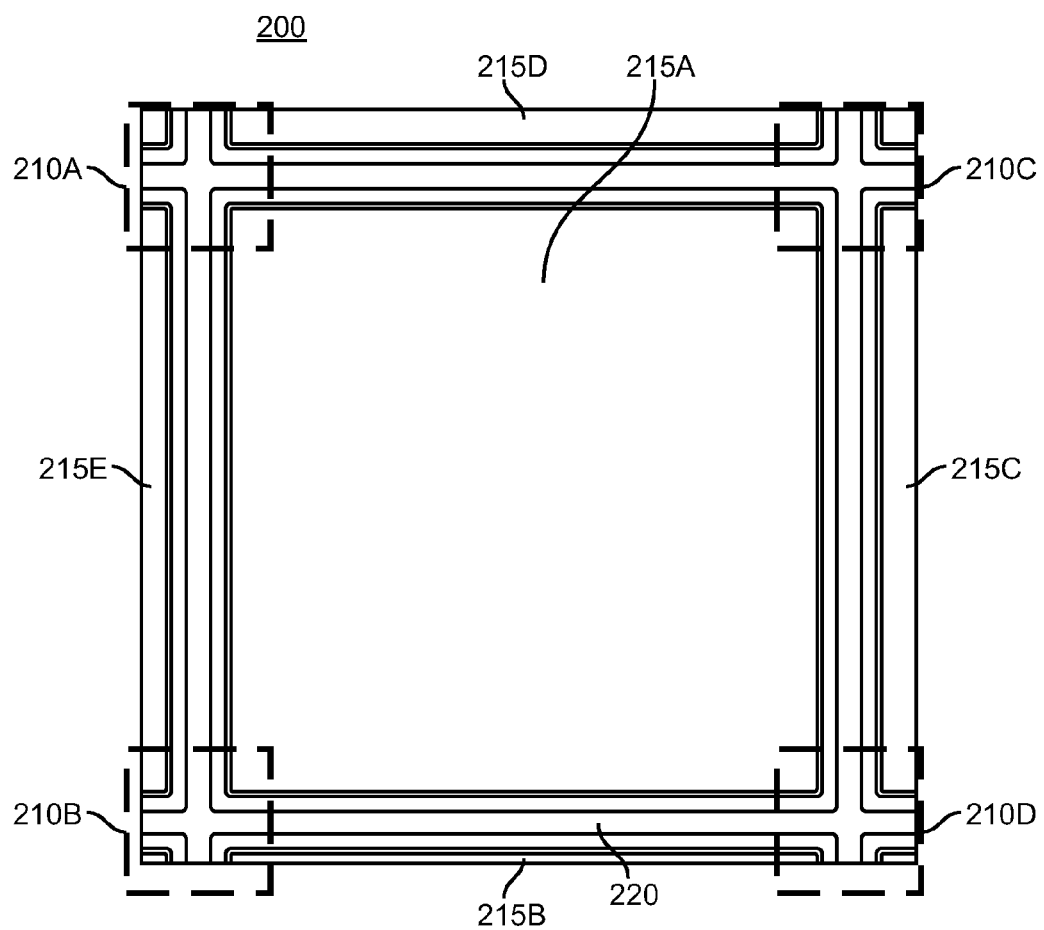
FIG. 2A is an illustration of a top view of an HED rectifier that is made to have a planar structure between edge termination to trenches and trenches to mesa regions.

FIG. 2A is an illustration of a top view of a die 200 having HED rectifiers which are made to have a planar structure between edge termination to trenches and trenches to mesa regions. The HED rectifiers in die 200 have a reduced reverse leakage current caused by non-planarity. Die 200 includes diagonal opposite corners 210A-210D that have the same layout, regions 215A-215E which can include active devices, and street 220. In other embodiments, only some of the diagonal opposite corners 210A-210D have the same layout.

Figure 2B:
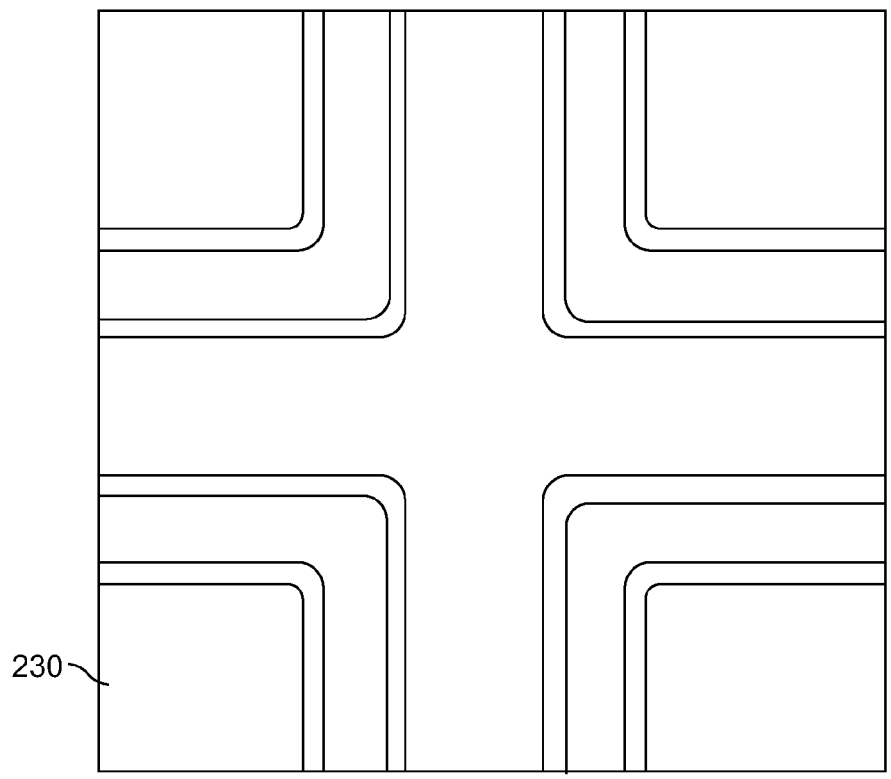
FIGS. 2B-2C are expanded views of one of the HED rectifier corners showing active devices separated by streets.
Figure 2C:
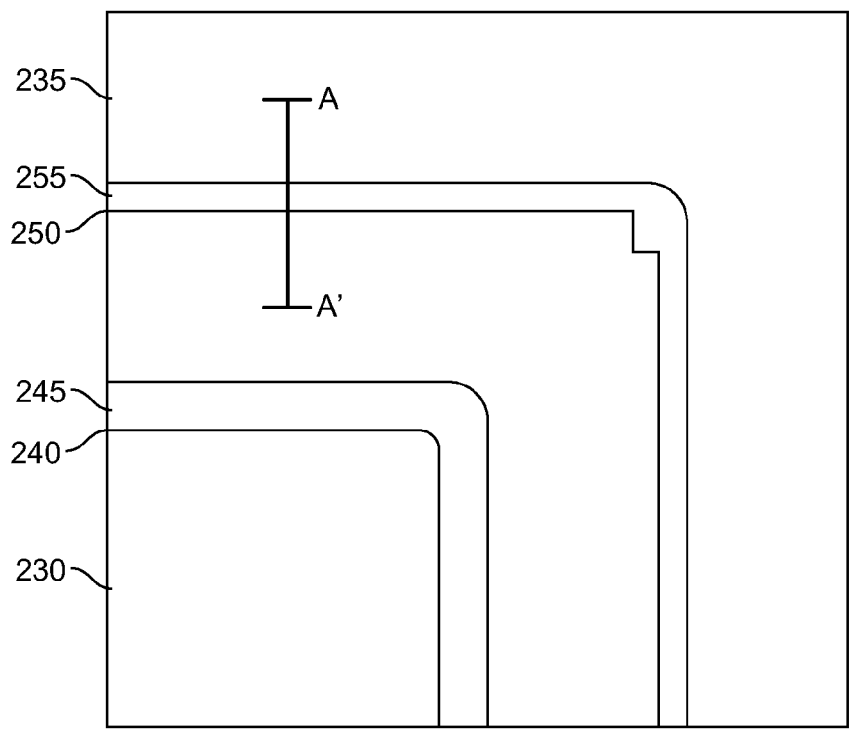

FIGS. 2B and 2C are expanded views of one of the corners 210A-210D showing active devices 215A-215E with street separation 220. The expanded views of the top of the die 200 include a solderable top metal (STM) 230, a dielectric opening 240, an end of the STM 245, a contact opening 250, and an aluminum under dielectric region 255. The STM layer can be a (Ti—NiV—Ag) pad with topography lines of contact and aluminum layers. In some embodiments, the Ag layer is slightly etched back from the NiV layer resulting in two topography lines. FIG. 2C shows one representative location where cross sections along lines A-A' can be taken as illustrated in FIGS. 3A-3K.

FIGS. 3A-3K are simplified cross section views at various stages of a process for forming a HED rectifier, in accordance with one embodiment of the invention. FIGS. 3A-3K illustrate the process of forming the region of the HED rectifier identified in region A-A' as illustrated in FIG. 2C. However, the techniques illustrated in FIGS. 3A-3K are applicable for forming HED rectifiers located in other regions of die 200. In FIGS. 3A-3K, various operations are performed on an epitaxial layer 302, which is disposed on a substrate 300, to form an HED rectifier having a planar structure between edge termination to trenches and trenches to mesa regions, which reduces reverse leakage current caused by non-planarity. Many HED rectifiers similar to that shown in FIGS. 3A-3K are typically dispersed throughout the active region of the die 200 in a predetermined frequency.

Figure 3A:
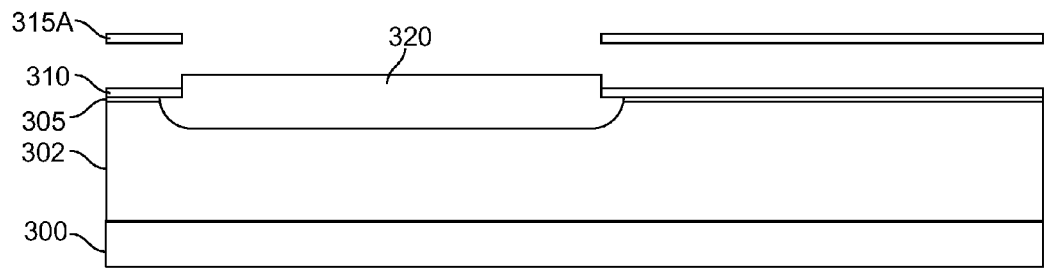
FIGS. 3A-3K are simplified cross section views at various stages of a process for forming a HED rectifier, in accordance with one embodiment of the invention.

FIG. 3A, which illustrates a partially fabricated HED rectifier along the cutline A-A', includes a substrate 300, an epitaxial layer 302, a pad oxide layer 305, a nitride layer 310, exposed photo resist coat 315A, and a field oxide region 320. The substrate 300 can be an N-type wafer which has been previously scribed with a laser to include information such as device type, lot number, and wafer number. The substrate 300 can also be a highly doped N+ substrate. The epitaxial layer 302, which is formed over the substrate 300, can be made of the same conductivity or different conductivity than the substrate 300. MOSFETs are formed when the substrate 300 and epitaxial layer 302 are of the same conductivity type, and IGBTs are formed when the substrate 300 has the opposite conductivity type to that of the epitaxial layer 302. In some embodiments, the epitaxial layer 302 is made of lightly doped n-type material. The semiconductor region is a lightly doped n-type epitaxial layer 302 formed over a highly doped substrate 300. A pad oxide layer 305 ranging from 200 Å to 400 Å is grown on the epitaxial layer 302 using an oxidation process. The epitaxial layer 302 is epitaxially grown on a substrate 300. The pad oxide layer 305 is used for adherence and stress relief for subsequently deposited layers. In some embodiments the substrate is cleaned prior to forming the pad oxide layer 305. The nitride layer 310, which ranges from 500 Å to 2000 Å, is deposited over the pad oxide layer 305. In some embodiments, the nitride layer 310 is maintained between 1000 Å to 1500 Å. The nitride layer 310 is used to protect the active area of the device during the field oxidation process. The exposed photo resist coat 315A is used for field photolithography and defines future field oxide and alignment targets. The exposed photo resist 315A is shown as exposed and developed. The field oxide region 320 is formed by first etching the nitride layer 310, and then the oxide layer 305, and may extend into the epitaxial layer 302, which will eventually become part of the field oxide region 320, stripping the masks used to perform the etching, cleaning the device and then growing the field oxide region 320 to be recessed in the silicon substrate with some of the field oxide region being above the top surface of the epitaxial layer 302.

Figure 3B:
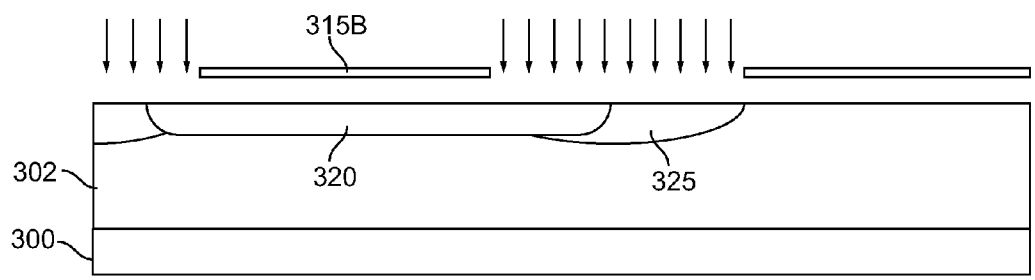

FIG. 3B, which illustrates a further partially fabricated HED rectifier along the cutline A-A', includes the substrate 300, an epitaxial layer 302, exposed photo resist coat 315B, the field oxide region 320 and an implant region 325. The exposed photo resist coat 315B is used for field photolithography and defining the subsequent implant regions. The exposed photo resist 315B is shown as exposed and developed. In one embodiment a chemical mechanical planarization (CMP) process is performed on the HED rectifier illustrated in FIG. 3A to planarize the field oxide to silicon mesa portions. The implant region 325 is produced by implanting boron into the regions that are not covered by the exposed photoresist 315B. In one embodiment boron is implanted using a dosage ranging from 1e13 to 1e14 ions/cm2 and an energy ranging from 40 to 200 KeV. In some embodiments, the implantation energy is increased in order to produce a P-iso under the field oxide layer 320. After the boron is implanted, the exposed photo resist 315B is removed using oxygen plasma resist strip. After the oxygen plasma strip, the HED rectifier is cleaned using combinations of $H_2SO_4/H_2O_2$, mega Sonics, $NH_4OH$, $H_2O_2$, and DI Water. In some embodiments, the implant regions 325 are omitted. In the embodiments where implant regions 325 are omitted, the following FIGS. 3C-3K would also have the implant regions 325 omitted.

Figure 3C:
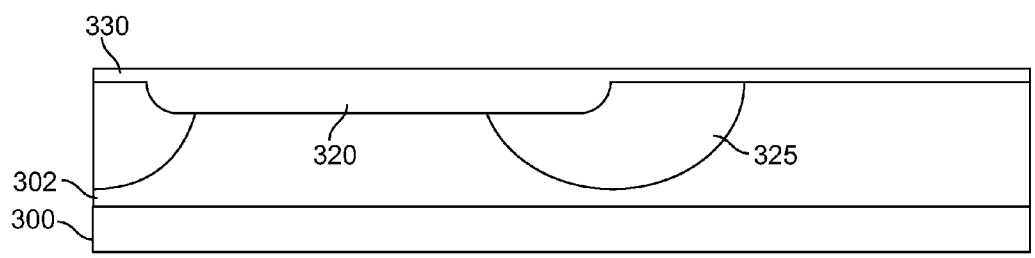

FIG. 3C, which illustrates a further partially fabricated HED rectifier along the cutline A-A', includes the substrate 300, an epitaxial layer 302, the field oxide region 320, an implant region 325, and a hard mask layer 330. In one embodiment a P-Iso drive is performed. The hard mask layer 330 is also grown over the substrate 300, the epitaxial layer 302, the field oxide region 320 and the implant region 325. The hard mask 330 is used later to define trench etch areas. The thickness of the hard mask 330 depends upon photo resist type and thickness used to define trench critical dimensions (CD) and depth. In one embodiment, the hard mask oxide is thermally grown. In another embodiment the hard mask oxide is deposited (i.e sputter, CVD, PVD, ALD, or combination of deposition and thermal growth). This hard mask 330 is produced with an oxidation process that may cause film thickness variations between field and active regions causing non-uniform trench dimensions in areas of trench termination (i.e. CD change of 5%).

Figure 3D:
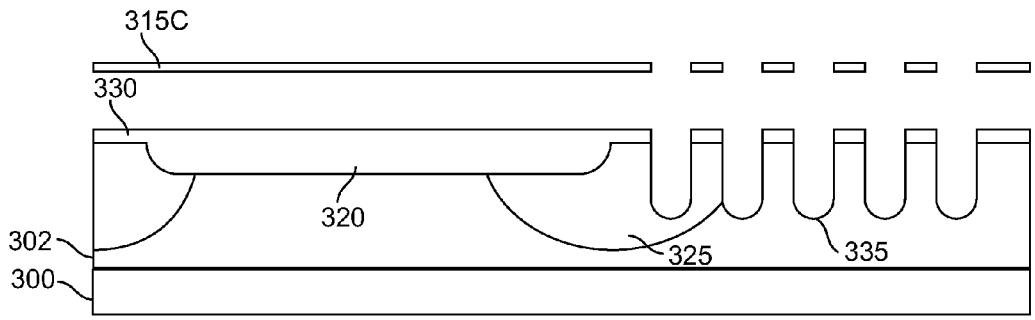

FIG. 3D illustrates one way of forming trenches in a partially fabricated HED rectifier. FIG. 3D, which illustrates this formation, as seen along cutline A-A' includes the substrate 300, an epitaxial layer 302, the field oxide region 320, an implant region 325, the hard mask layer 330, an exposed photoresist 315C, and trenches 335. The exposed photo resist coat 315C is used for field photolithography and defining the subsequent formed trenches 335. The exposed photo resist 315C is shown as exposed and developed. A plasma etch is used to open the hard mask layer 330 where trenches will be etched later. After the trench 335 openings are formed in the hard mask layer 330, in one embodiment the exposed photo resist 315C is removed using oxygen plasma resist strip prior to etching trenches 335. The trenches 335 are formed by etching. The etching process can involve using gaseous etchants such as, for example, $SF_6/He/O_2$ chemistries. The depth of the trenches can range from 0.5 to 10 μm. In some embodiments, the trenches are etched to a depth of approximately 1.20 um. The etching process is selected so that the etching is selective to silicon rather than the hard mask layer 330 material.

Figure 3E:
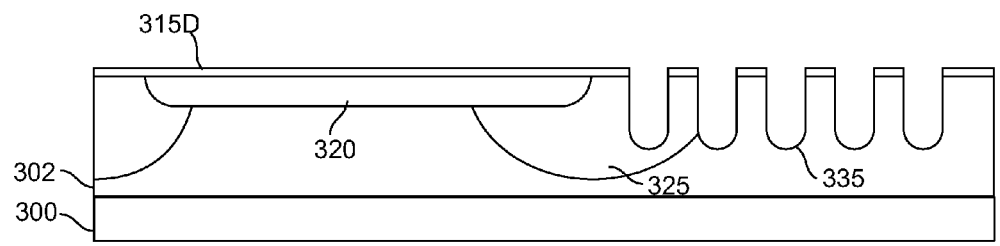

FIG. 3E illustrates an alternative to the methods illustrated in FIGS. 3C-3D for P-iso driving and trench formation. FIG. 3E, which illustrates this formation, as seen along cutline A-A' includes the substrate 300, the epitaxial layer 302, the field oxide region 320, an implant region 325, an exposed photoresist 315D, and trenches 335. A comparison of FIG. 3E with FIGS. 3C-3D shows that the method illustrated in FIG. 3E does not use a hard mask layer 330 which results in fewer processing steps and a potentially more planar surface between the field regions and active regions of the final HED rectifier device. The P-iso drive is performed in nitrogen at ambient pressure. Since the exposed photoresist 315D pattern will be used as an etch mask and a hard mask layer 330 is not formed, this process reduces or eliminates oxide thickness variations between field oxide region 320 and the oxide hard mask layer 330. The etching process is selected so that the etching is selective to silicon rather than the exposed photoresist 315D material.

Figure 3F:
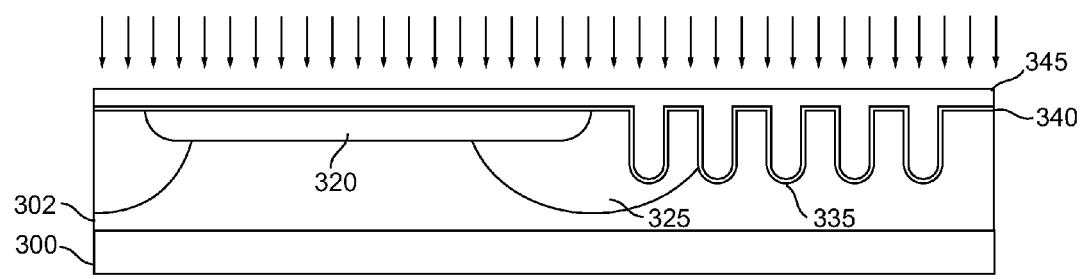

FIG. 3F illustrates the formation of a shield dielectric layer and polysilicon in a partially fabricated HED rectifier having trenches already formed. FIG. 3F, which illustrates the formation of the shield dielectric layer and polysilicon, as seen along cutline A-A' includes the substrate 300, the epitaxial layer 302, the field oxide region 320, an implant region 325, trenches 335 shield dielectric layer 340, and polysilicon 345. Before the shield dielectric layer 340 is deposited, the partially fabricated HED rectifier is cleaned. The cleaning process can include a hydrogen fluoride (HF) etch and second soft etch, which can clean the trenches 335 and remove residual polymer. Once the HED rectifier is cleaned, the shield dielectric layer 340, also know as the gate oxide, is formed. In some embodiments the shield dielectric layer 340 can be thermally grown, deposited using atomic layer deposition, physical vapor deposition, chemical vapor deposition, or combination thereof. In one embodiment, the shield dielectric layer 340 can have a thickness of approximately 400±50 Å. However the thickness of the shield dielectric layer 340 can range from 200 to 5000 Å, depending on the specific application. The shield dielectric layer quality and thickness determines the device capability for electric field and breakdown voltage. The shield dielectric layer 340 is deposited so that it follows the contours of the trench and the substrate. The shield dielectric layer 340 is deposited along the bottom and sidewalls of the trench 335 and along the top of the epitaxial layer 302, the field oxide region 320 and an implant region 325. In some embodiments, the shield dielectric layer 340 can form a contiguous film along the bottom and sidewalls of the trench 335 and along the top of the epitaxial layer 302, the field oxide region 320 and the implant region 325. The shield dielectric layer 340 can be formed by exposing the HED rectifier to oxygen diluted in an inert gas such as argon, helium, or xenon at high temperatures over 1000° C. The shield dielectric layer 340 can form a thick bottom oxide (TBO) in the trenches 335 to improve breakdown voltage capabilities.

After the shield dielectric layer 340 is deposited, the polysilicon 345 material is deposited inside the trench 335 and over the top of the shield dielectric layer 340. The polysilicon material which is deposited into the trenches 335 and over the shield dielectric layer 340 is amorphous undoped polysilicon and has a thickness of approximately 5500 Å±500 Å. The polysilicon material is then doped by implanting boron. In one embodiment, boron is implanted into the undoped polysilicon material using a high carrier concentration.

Figure 3G:
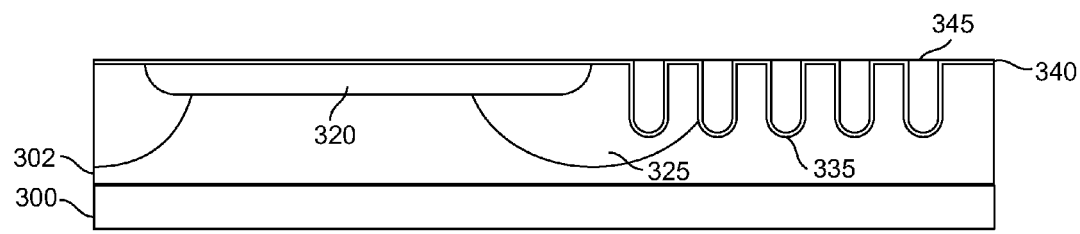

FIG. 3G illustrates the process of annealing the polysilicon, removing the excess polysilicon and etching recesses in a partially fabricated HED rectifier shown in FIG. 3F. FIG. 3G, which illustrates annealing the polysilicon, removing the excess polysilicon and etching recesses, as seen along cutline A-A', includes the substrate 300, the epitaxial layer 302, the field oxide region 320, the implant region 325, trenches 335 shield dielectric layer 340, and polysilicon 345. Once the HED rectifier is cleaned, the polysilicon 345 material is annealed by heating the partial HED rectifier. The excess polysilicon 335 material is then removed using CMP. The CMP process removes the excess polysilicon 335 material disposed on top of the shield dielectric layer 340 outside of the trenches 335 with the use of a chemical slurry and abrasive grinding pad specially designed for removing polysilicon film. The CMP tool dispenses a chemical slurry mixture onto the top surface of the wafer. The grinder head, which has an abrasive pad attached to the head, is then lowered to come into contact with upper polysilicon surface and the slurry. The slight chemical etch provided by the slurry coupled with the force of the abrasive pad provided by the head causes the polysilicon to be planarized to the shield dielectric surface. The CMP process can also be used to remove some of the shield dielectric layer 340 disposed outside of the trench 335, leaving behind a thinner shield dielectric layer 340 outside of trenches 335 than inside of trenches 335. After the partial HED rectifier has been processed with CMP, the resulting partial HED rectifier has the shield dielectric layer 340 partially extending above the epitaxial layer 302, and trenches 335 with the polysilicon 345 material filling the trenches 335 up to the shield dielectric layer 340 and flush with the top of the shield dielectric layer 340.

In other embodiments, a CMP process can be used to further remove the remaining shield dielectric on the tops of the mesas. In this embodiment an end point detector can be used to determine when the polysilicon has been removed. After the polysilicon is removed the CMP process can be changed to a different CMP process to remove the shield dielectric layer. Changing to a different CMP process can include changing the slurry composition and pad abrasiveness to one which is designed to etch oxides. Once the CMP setup and process is changed the shield dielectric is removed from the mesa surface using this new CMP process. This new CMP process is stopped when silicon is exposed.

Figure 3H:
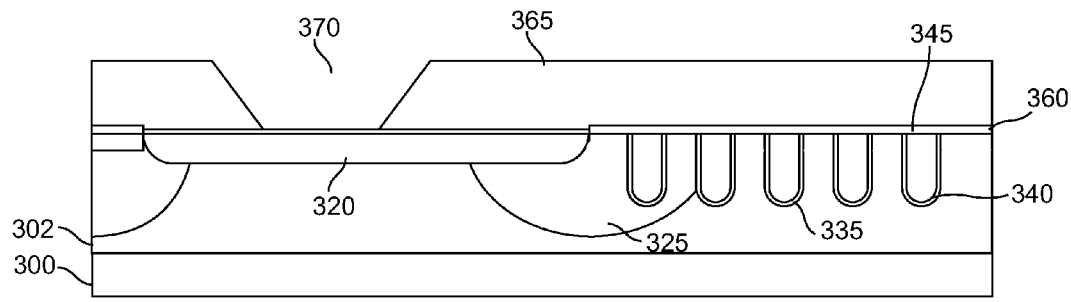

FIG. 3H, which illustrates the partially fabricated HED rectifier after having several metallic layers deposited, as seen along cutline A-A', includes the substrate 300, the epitaxial layer 302, the field oxide region 320, the implant region 325, trenches 335 shield dielectric layer 340, and polysilicon 345, a nickel silicide layer (NiSi) 360, a top metal 365 and an opening 370. The NiSi layer 360 is formed by depositing nickel over the planarized region having exposed polysilicon 345 in the trenches 335 and exposed silicon which forms the mesas between the trenches 335. Nickel silicide (NiSi) forms when the nickel is exposed to the silicon from substrate 300 and some subsequent heat treatment ranging from 250° C. to 550° C. is applied. The un-reacted nickel is removed from the oxide areas. In some cases, the un-reacted nickel can be left behind. In some embodiments that NiSi layer can be sputter deposited and the thickness can be approximately 600 Å. In other embodiments the thickness of the NiSi layer can range from 100 Å to 1000 Å. In some embodiments the NiSi layer can be etched to clean the surface before additional steps are performed. The NiSi layer 360 can alternatively be other materials that form a Schottky layer such as platinum, cobalt, etc. The top layer 365 is formed by depositing Al/Si/Cu over the NiSi layer 360 and the shield dielectric layer 340 which has been deposited over the field oxide region 320. After the top layer 365 is formed, a portion of the top layer 365 is etched to form opening 370. In this etching process, the top layer 365 is etched down to the field oxide region 320. In some embodiments, the un-reacted nickel can also be etched at this time thus minimizing potential aluminum spiking over active cells and reducing the number of processing steps.

Figure 3I:
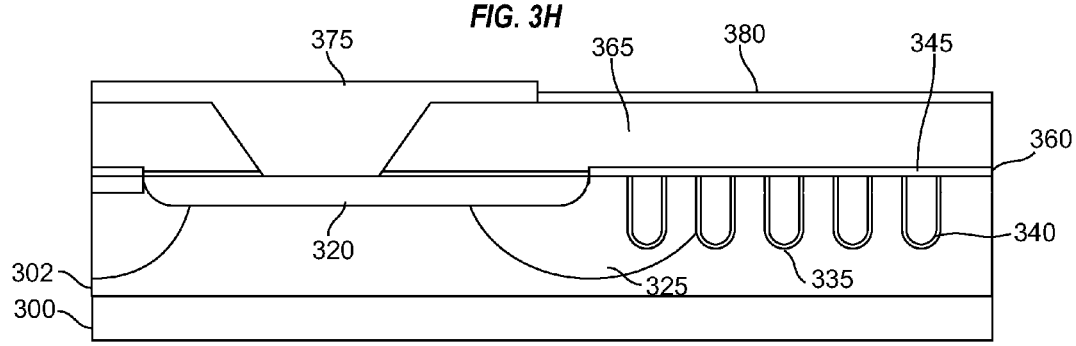

FIG. 3I, which illustrates the partially fabricated HED rectifier after formation of the top layer 365 with opening 370, as seen along cutline A-A', includes the substrate 300, the epitaxial layer 302, the field oxide region 320, the implant region 325, trenches 335 shield dielectric layer 340, and polysilicon 345, a NiSi layer 360, a top metal 365, a dielectric layer 375 and a mask layer 380. The dielectric layer 375 is formed by depositing over the entire structure illustrated in FIG. 3H a dielectric material. The dielectric material can be polyimide, BCB, nitride, oxy-nitride films that act as a dielectric material, polyimide and deposited silicon nitride, polyimide and deposited silicon dioxide, polyimide and deposited silicon oxy-nitride, silicon nitride, silicon oxy-nitride, or silicon dioxide. After the dielectric material is deposited, a mask layer 380 is applied over the dielectric layer and a portion of the dielectric layer is etched leaving behind dielectric material over most of the field oxide region 320 and over a portion of the top metal but not over the trenches 335. The device can then be alloyed by subjecting the device to temperatures ranging between 350° C.-500° C. in the presence of forming gas or Hydrogen containing gas to allow any interface layer that may exist between the metal and Si or metal to metal to be consumed. This alloying forms an improved contact through interdiffusion between the silicon substrate 300, the NiSi layer 360 and the top layer 365. This alloy step can also is used to anneal out any surface states (i.e. interfaces trap at the oxide to silicon interface).

Figure 3J:
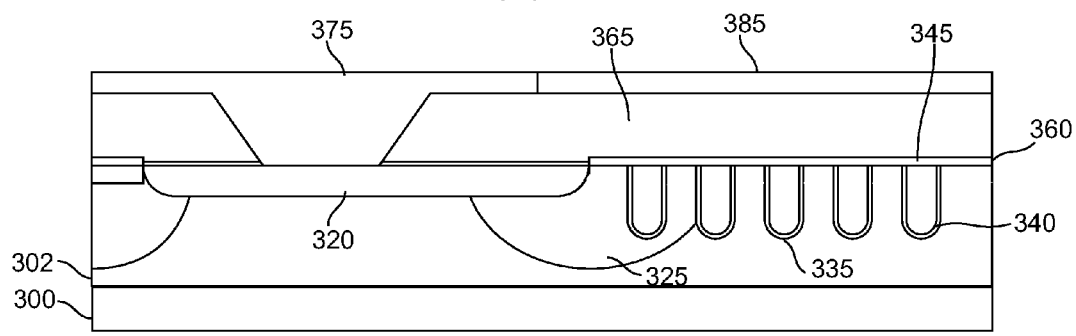

FIG. 3J illustrates the partially fabricated HED rectifier shown in FIG. 3I after forming the patterned dielectric layer 375. FIG. 3J, which illustrates the partially fabricated HED rectifier after formation of the patterned dielectric layer 375, as seen along cutline A-A', includes the substrate 300, the epitaxial layer 302, the field oxide region 320, the implant region 325, trenches 335, shield dielectric layer 340, and polysilicon 345, a NiSi layer 360, a top metal 365, a dielectric layer 375 and a solderable top metal (STM) layer 385. Before the STM layer 385 is formed, the HED rectifier shown in FIG. 3I is cleaned to remove thin AlO$_3$ films that may have formed. The STM layer 385 is formed by depositing a solderable material such as Ti/NiV/Ag, Ta/Cu, tin or other solderable metals. The STM layer 385 can be formed using various deposition methods such as electroless deposition. After the STM layer 385 is deposited, a pattern can be formed on top for later bonding. In some embodiments, the STM layer 385 can be further etched or processed using CMP. In some embodiments, the tops of the dielectric layer 375 and the STM layer 385 are substantially coplanar.

Figure 3K:
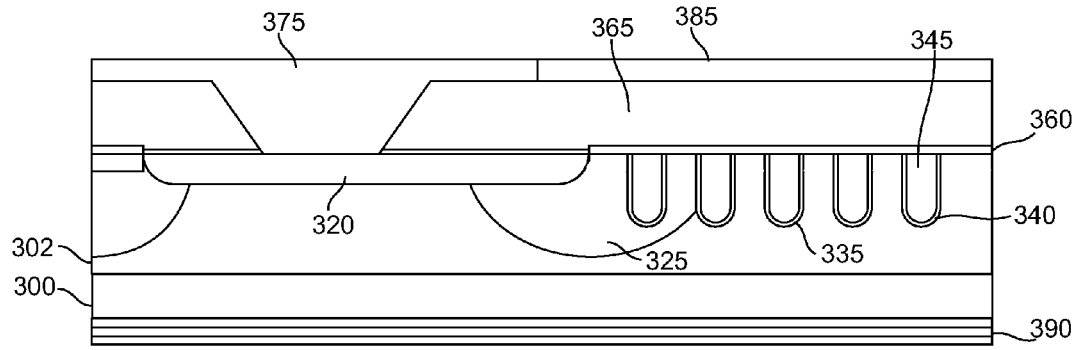

FIG. 3K illustrates the partially fabricated HED rectifier shown in FIG. 3J after forming the STM layer 385, as seen along cutline A-A', and includes the substrate 300, the epitaxial layer 302, the field oxide region 320, the implant region 325, trenches 335 shield dielectric layer 340, polysilicon 345, NiSi layer 360, a top metal 365, a dielectric layer 375, an STM layer 385, and a back metal 390. Before the back layer 390 is formed, the bottom of the substrate 300 undergoes a mechanical back grinding process that grinds off a portion the substrate 300. After the grinding process, the back metal 390 is formed. The back metal 390 can include layers of Ti, NiV and Ag as well as other metals and is not limited to these specific metallic films.

Figure 4:
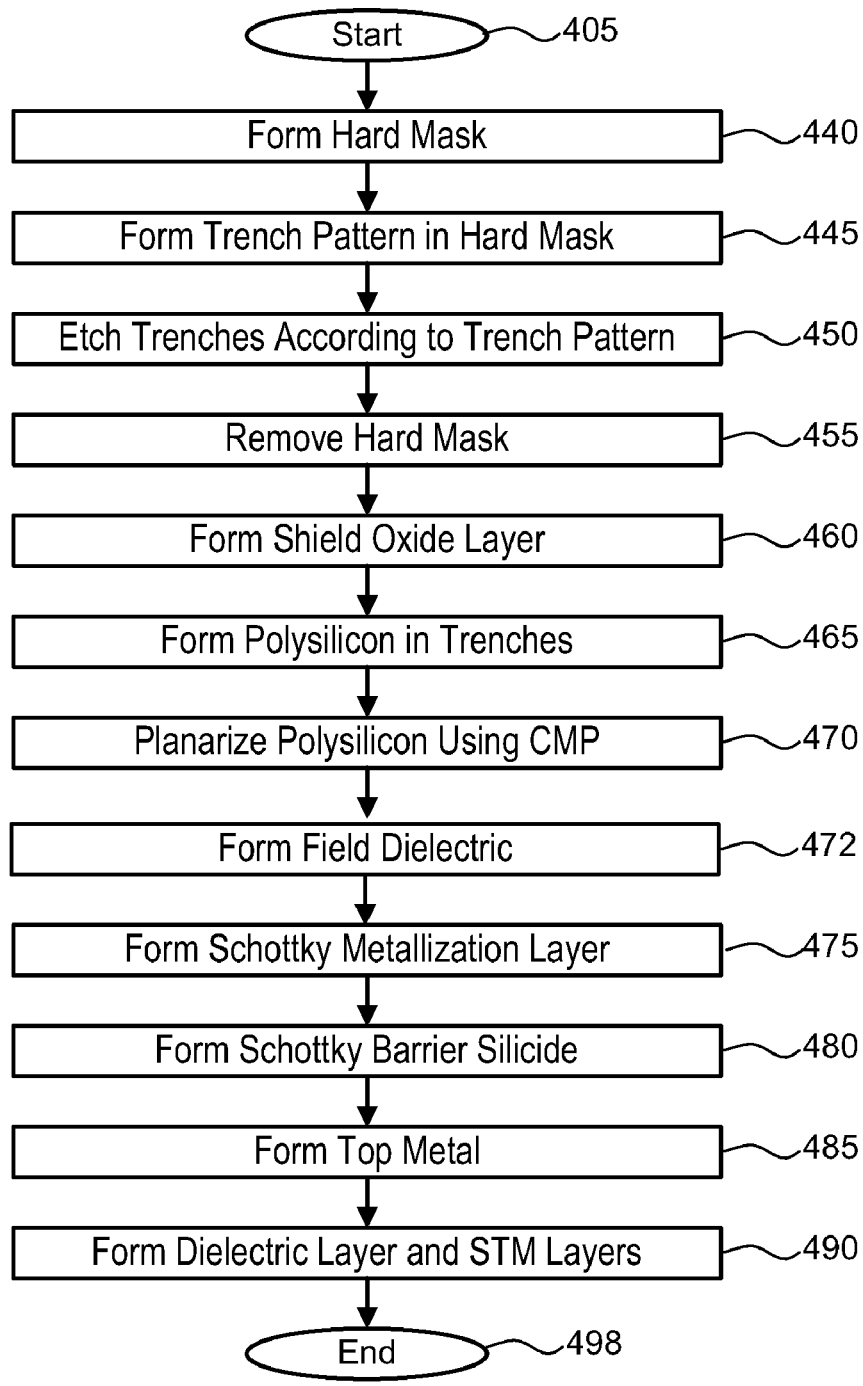
FIG. 4 is a flowchart illustrating a method of forming a semiconductor device using CMP to planarized polysilicon deposited in trenches and above an epitaxial layer of a substrate.

FIG. 4 is a flowchart illustrating a method of forming a semiconductor device using CMP to planarized polysilicon deposited in trenches and above an epitaxial layer deposited on a substrate. The semiconductor device made using CMP to planarized the polysilicon has a planar structure between edge termination to trenches and trenches to mesa regions to reduce reverse leakage current caused by non-planarity. The method starts in operation 405 when a substrate is provided. The substrate can be N-Type wafer with an epitaxial layer deposited on top. Next in operation 440, a hard mask oxide is grown. The hard mask will be used in subsequent operations to form various features including trenches 335. In operation 445 the hard mask is patterned. In operation 450, trenches 335 are formed using an etch process. In one embodiment the trenches 335 have a pitch ranging from 0.8-1.0 um, a critical dimension ranging from 0.4-0.6 um, and a depth ranging from 0.5-5.0 um. However, in other embodiments the trenches can have values for the pitch, critical dimension, and depth which are outside of these ranges. In operation 455, the hard mask is removed. The hard mask can be removed using various techniques or combinations of techniques such as etching, wet BOE, which just removes the remaining hard mask oxide, or CMP which planarizes the field to active regions. In some embodiments, operation 455 is optional and the hard mask can be left on for future removal post polysilicon etch.

In operation 460, the shield dielectric layer 340 is formed so that it follows the contours of the trench and the substrate. The shield dielectric layer 340 can be formed by growing the oxide layer, depositing the oxide layer or combinations of growing and depositing the oxide. The shield dielectric layer 340 is formed along the bottom and sidewalls of the trench 335 and along the top of the epitaxial layer 302, and an implant region 325. The shield dielectric layer 340 can have a thickness ranging from 200 Å to 5000 Å depending on the breakdown voltage of the device. In one embodiment, the shield dielectric layer 340 can have a thickness of approximately 400±50 Å. In some embodiments, the shield dielectric layer 340 can form a contiguous film along the bottom and sidewalls of the trench 335 and along the top of the epitaxial layer 302, and the implant region 325. The shied oxide layer 340 can be formed by exposing the HED rectifier to oxygen diluted in an inert gas such as argon, helium, or xenon at elevated temperatures. In operation 465, the polysilicon 345 material is deposited inside the trench 335 and over the top of the shield dielectric layer 340. In one embodiment the polysilicon material is amorphous undoped polysilicon and has a thickness of approximately 5500 Å±500 Å. The polysilicon can be doped by several methods, such as vapor phase doping of polysilicon or implanting of dopant ions with dopant species such as boron, phosphorous, arsenic (the doping species are not limited to these examples). In another embodiment, the polysilicon could be a single crystal polysilicon. In another embodiment, the polysilicon could be insitu doped polysilicon using dopant gases during a deposition cycle. In operation 470, excess polysilicon 335 material is removed and the polysilicon to silicon mesa regions are planarized. In one embodiment, this planarization is performed using CMP. The CMP process removes the excess polysilicon 335 material disposed on top of the shield dielectric layer 340 outside of the trenches 335. The CMP process can also be used to remove some of the shield dielectric layer 340 disposed outside of the trench 335, leaving behind a thinner shield dielectric layer 340 outside of trenches 335 than inside of trenches 335. After the partial HED rectifier has been processed with CMP, the resulting partial HED rectifier has the shield dielectric layer 340 partially extending above the epitaxial layer 302 and trenches 335 with the polysilicon 345 material filling the trenches 335 up to the shield dielectric layer 340 and flush with the top of the shield dielectric layer 340. Planarizing the polysilicon using CMP generates a substantially planar surface having substantially planar regions of polysilicon and gate oxide. The regions of polysilicon and gate oxide formed by planarizing form a substantially flat contiguous surface.

Next in operation 472, a field dielectric region 320, which can be an oxide region, is formed in the epitaxial layer 302 and is recessed into the epitaxial layer 302 with some of the field dielectric region 320 being above the epitaxial layer 302 plane. In one embodiment, the field dielectric region 320 is deposited. In operation 475, a Schottky metallization layer is deposited. Next in operation 480, a Schottky barrier silicide is formed. In some embodiments, the Schottky metallization layer is omitted and operations 475 and 480 are not used. In operation 485 a top metal 365 containing aluminum is formed. The top metal 365 is formed over a Schottky metallization layer and over a portion of the gate oxide layer. In operation 490 a dielectric layer 375 and STM layer 385 are formed. The dielectric can be polyimide, PECVD oxy-nitride, PECVD nitride, BCB, oxy-nitride films that act as a dielectric material, polyimide and deposited silicon nitride, polyimide and deposited silicon dioxide, polyimide and deposited silicon oxy-nitride, silicon nitride, silicon oxy-nitride, silicon dioxide, or some other dielectric. The dielectric layer 375 is formed according to a pattern and the STM layer 385 is formed over the top metal 365. Finally, in operation 498, the HED rectifier is completed.

Figure 5:
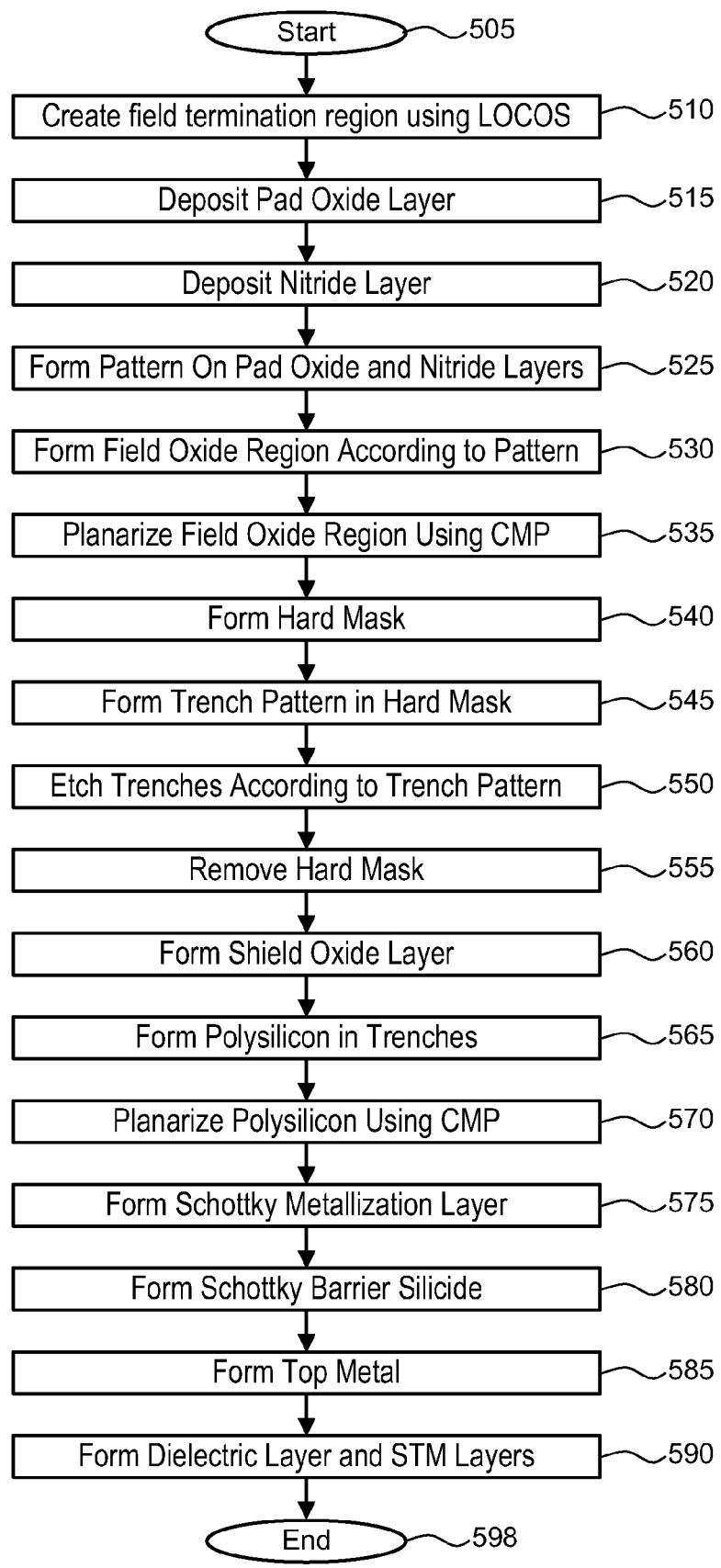
FIG. 5 is a flowchart illustrating a method of forming a semiconductor device using CMP to planarize an oxide layer and using CMP to planarized polysilicon deposited in trenches and above an epitaxial layer disposed on a substrate.

FIG. 5 is a flowchart illustrating a method of forming a semiconductor device using CMP to planarize a field oxide layer and using CMP to planarized polysilicon deposited in trenches and above an epitaxial layer. The semiconductor device made using CMP to planarize the field oxide layer and the polysilicon has a planar structure between edge termination to trenches and trenches to mesa regions to reduce reverse leakage current caused by non-planarity. The method starts in operation 505 when a substrate is provided. The substrate can be N-Type wafer with an epitaxial layer deposited on top. Next in operation 510 a field termination region is created using LOCOS oxidation methods. Next in operation 515 a pad oxide layer 305 is formed over the substrate using an oxidation process. The thickness of the pad oxide layer 305 can range from 200 Å to 400 Å. In operation 520, a nitride layer 310 is deposited over the pad oxide layer 305. The thickness of the nitride layer 310 ranges from 1000 Å to 1500 Å. In operation 525, a pattern is formed in the pad oxide layer 305 and nitride layer 310 using photolithography and etching. The photoresist is also removed in this operation. After the pattern is formed, in operation 530, a field oxide region 320 is formed in the epitaxial layer 302 and is recessed into the epitaxial layer 302 with some of the field oxide region 320 being above the epitaxial layer 302 plane. In operation 535, the field oxide region is planarized using a CMP etch process to generate a substantially planar surface having substantially planar regions of field oxide and epitaxial layer.

In operation 540, a hard mask oxide is deposited or grown. The hard mask will be used in subsequent operations to form various features including trenches 335. In operation 545 the hard mask is patterned. In operation 550, trenches 335 are formed using an etch process. In one embodiment the trenches 335 have a pitch ranging from 0.8-1.0 um, a critical dimension ranging from 0.4-0.6 um, and a depth ranging from 0.5-5.0 um. However, in other embodiments the trenches can have values for the pitch, critical dimension, and depth which are outside of these ranges. In operation 555, the hard mask is removed. The hard mask can be removed using various techniques or combinations of techniques such as etching, wet BOE, which just removes the remaining hard mask oxide with minimum attack to field oxide, or CMP which planarizes the field to active regions. In some embodiments, operation 555 is optional and the hard mask can be left on for future removal post polysilicon etch.

In operation 560, the shield dielectric layer 340 is formed so that it follows the contours of the trench and the substrate. The shield dielectric layer 340 can be formed by growing the oxide layer, depositing the oxide layer or combinations of growing and depositing the oxide. The shield dielectric layer 340 is formed along the bottom and sidewalls of the trench 335 and along the top of the epitaxial layer 302, the field oxide region 320 and an implant region 325. The shield dielectric layer 340 can have a thickness of approximately 400±50 Å. In some embodiments, the shield dielectric layer 340 can form a contiguous film along the bottom and sidewalls of the trench 335 and along the top of the epitaxial layer 302, the field oxide region 320 and the implant region 325. The shied oxide layer 340 can be formed by exposing the HED rectifier to oxygen diluted in an inert gas such as argon, helium, or xenon at high temperatures. In operation 565, the polysilicon 345 material is deposited inside the trench 335 and over the top of the shield dielectric layer 340. The polysilicon material is amorphous undoped polysilicon and has a thickness of approximately 5500 Å±500 Å. The polysilicon material can then be doped by implanting boron. In operation 570, excess polysilicon 335 material is removed and the polysilicon to silicon mesa regions are planarized. In one embodiment this planarization is performed using CMP. The CMP process removes the excess polysilicon 335 material disposed on top of the shield dielectric layer 340 outside of the trenches 335. The CMP process can also be used to remove some of the shield dielectric layer 340 disposed outside of the trench 335, leaving behind a thinner shield dielectric layer 340 outside of trenches 335 than inside of trenches 335. After the partial HED rectifier has been processed with CMP, the resulting partial HED rectifier has the shield dielectric layer 340 partially extending above the epitaxial layer 302 and trenches 335 with the polysilicon 345 material filling the trenches 335 up to the shield dielectric layer 340 and flush with the top of the shield dielectric layer 340. Planarizing the polysilicon using CMP generates a substantially planar surface having substantially planar regions of polysilicon, gate oxide and field oxide. The regions of polysilicon, gate oxide and field oxide formed by planarizing form a substantially flat contiguous surface. This process can be performed with or without a photo pattern.

In operation 575, a Schottky metallization layer is deposited. Next in operation 580, a Schottky barrier silicide is formed. In operation 585 a top metal 365 containing aluminum is formed. The top metal 365 is formed over a Schottky metallization layer and over a portion of the gate oxide layer. In operation 590 a dielectric layer 375 and STM layer 385 are formed. The dielectric layer 375 is formed according to a pattern and the STM layer 385 is formed over the top metal 365. In some embodiments the dielectric layer 375 is polyimide. Alternatively, the dielectric layer 375 can be PECVD oxy-nitride, PECVD nitride, BCB, oxy-nitride films that act as a dielectric material, polyimide and deposited silicon nitride, polyimide and deposited silicon dioxide, polyimide and deposited silicon oxy-nitride, silicon nitride, silicon oxy-nitride, silicon dioxide, or some other dielectric. Finally, in operation 598, the HED rectifier is completed.

Figure 6:
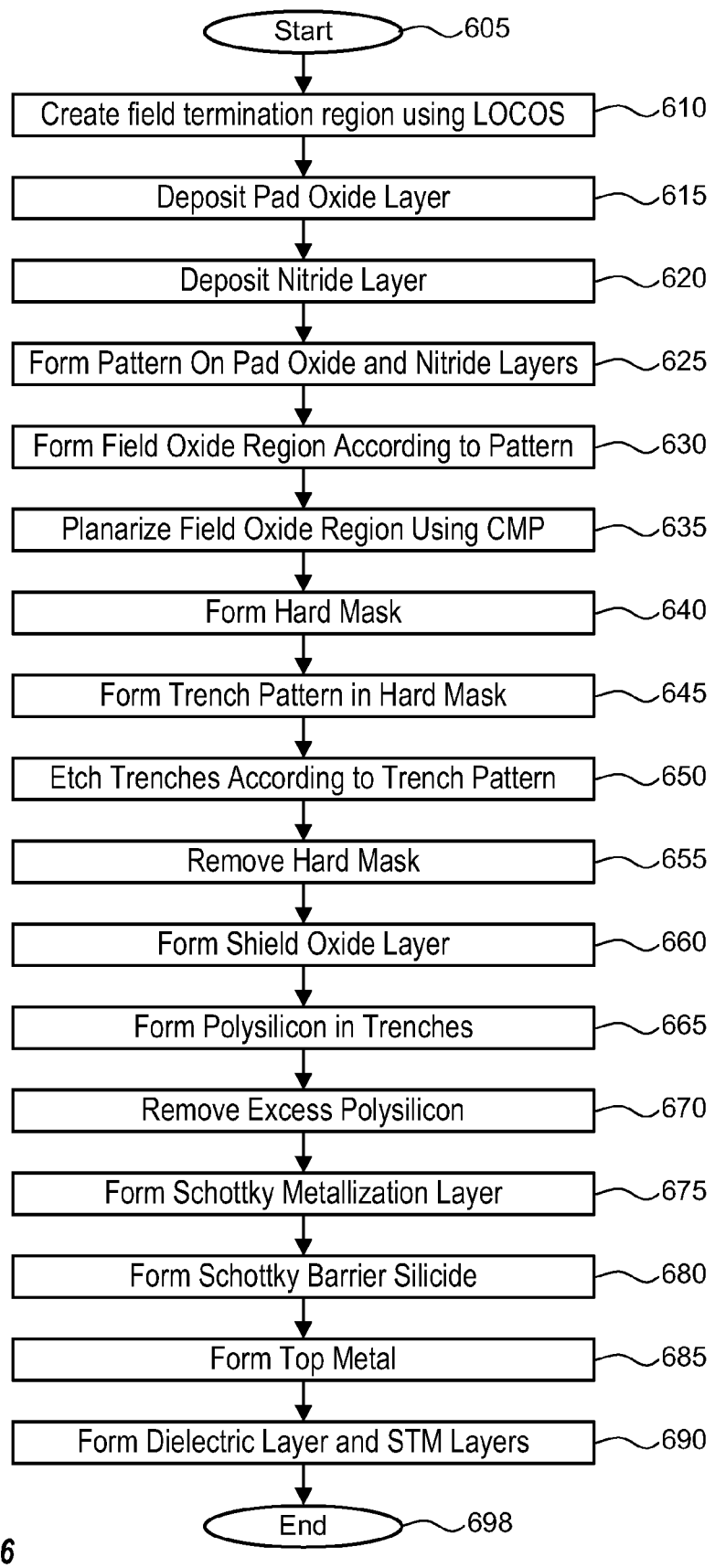
FIG. 6 is a flowchart illustrating a method of forming a semiconductor device using CMP to planarize an oxide layer.

FIG. 6 is a flowchart illustrating a method of forming a semiconductor device using CMP to planarize an oxide layer. The semiconductor device made using CMP to planarize the oxide layer has a planar structure between edge termination to trenches and trenches to mesa regions to reduce reverse leakage current caused by non-planarity. The method starts in operation 605 when a substrate is provided. The substrate can be an N-Type wafer with an epitaxial layer deposited on top. Next in operation 610 a field termination region is created using LOCOS oxidation methods. Next in operation 615 a pad oxide layer 305 is formed over the substrate using an oxidation process. The thickness of the pad oxide layer 305 can range from 200 Å to 400 Å. In operation 620, a nitride layer 310 is deposited over the pad oxide layer 305. The thickness of the nitride layer 310 ranges from 1000 Å to 1500 Å. In operation 625, a pattern is formed in the pad oxide layer 305 and nitride layer 310 using photolithography and etching. The photoresist is also removed in this operation. After the pattern is formed, in operation 630, a field oxide region 320 is formed in the epitaxial layer 302 and is recessed into the epitaxial layer 302 with some of the field oxide region 320 being above the epitaxial layer 302 plane. In operation 635, the field oxide region is planarized using a CMP etch process to generate a substantially planar surface having substantially planar regions of field oxide and epitaxial layer.

In operation 640, a hard mask oxide is grown. The hard mask will be used in subsequent operations to form various features including trenches 335. In operation 645 the hard mask is patterned. In operation 650, trenches 335 are formed using an etch process. In one embodiment the trenches 335 have a pitch ranging from 0.8-1.0 um, a critical dimension ranging from 0.4-0.6 um, and a depth ranging from 0.5-5.0 um. However, in other embodiments the trenches can have values for the pitch, critical dimension, and depth which are outside of these ranges. In operation 655, the hard mask is removed. The hard mask can be removed using various techniques or combinations of techniques such as etching, wet BOE, which just removes the remaining hard mask oxide with minimum attack to field oxide, or CMP which planarizes the field to active regions. In some embodiments, operation 655 is optional and the hard mask can be left on for future removal post polysilicon etch.

In operation 660, the shield dielectric layer 340 is formed so that it follows the contours of the trench and the substrate. The shield dielectric layer 340 can be formed by growing the oxide layer, depositing the oxide layer or combinations of growing and depositing the oxide. The shield dielectric layer 340 is formed along the bottom and sidewalls of the trench 335 and along the top of the epitaxial layer 302, the field oxide region 320 and an implant region 325. The shield dielectric layer 340 can have a thickness of approximately 400±50 Å. In some embodiments, the shield dielectric layer 340 can form a contiguous film along the bottom and sidewalls of the trench 335 and along the top of the epitaxial layer 302, the field oxide region 320 and the implant region 325. The shied oxide layer 340 can be formed by exposing the HED rectifier to oxygen diluted in an inert gas such as argon, helium, or xenon at high temperatures. In operation 665, the polysilicon 345 material is deposited inside the trench 335 and over the top of the shield dielectric layer 340. The polysilicon material is amorphous undoped polysilicon and has a thickness of approximately 5500 Å±500 Å. The polysilicon material can then be doped by implanting boron. In operation 670, excess polysilicon 335 material is removed. In one embodiment, the excess polysilicon 335 is removed using an Oxide/Nitride/Oxide (ONO) etch process. This process can be performed with or without a photo pattern.

In operation 675, a Schottky metallization layer is deposited. Next in operation 680, a Schottky barrier silicide is formed. In operation 685 a top metal 365 containing aluminum is formed. The top metal 365 is formed over a Schottky metallization layer and over a portion of the gate oxide layer. In operation 690 a dielectric layer 375 and STM layer 385 are formed. The dielectric layer 375 can be polyimide, PECVD oxy-nitride, PECVD nitride, BCB, oxy-nitride films that act as a dielectric material, polyimide and deposited silicon nitride, polyimide and deposited silicon dioxide, polyimide and deposited silicon oxy-nitride, silicon nitride, silicon oxy-nitride, silicon dioxide, or some other dielectric. The dielectric layer 375 is formed according to a pattern and the STM layer 385 is formed over the top metal 365. Finally, in operation 698, the HED rectifier is completed.

Figure 7:
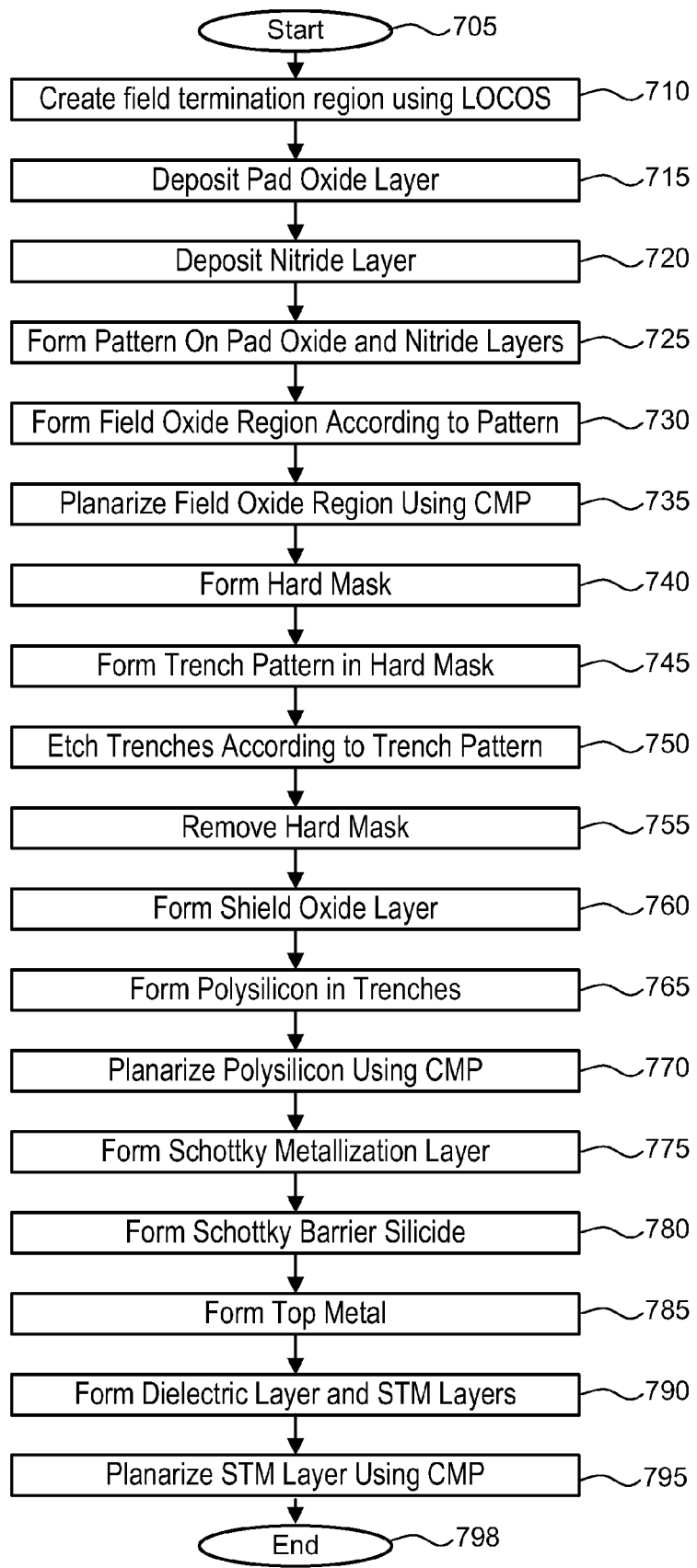
FIG. 7 is a flowchart illustrating a method of forming a semiconductor device using CMP to planarize an oxide layer, using CMP to planarized polysilicon deposited in trenches and above an epitaxial layer disposed on a substrate, and using CMP to planarized a STM layer.

FIG. 7 is a flowchart illustrating a method of forming a semiconductor device using CMP to planarize a field oxide layer, using CMP to planarized polysilicon deposited in trenches and above an epitaxial layer, and using CMP to planarized a STM layer. The semiconductor device made using CMP to planarized the field oxide layer, the polysilicon and the STM layer has a planar structure between edge termination to trenches and trenches to mesa regions to reduce reverse leakage current caused by non-planarity. The method starts in operation 705 when a substrate is provided. The substrate can be an N-Type wafer with an epitaxial layer deposited on top. Next in operation 710 a field termination region is created using LOCOS oxidation methods. Next in operation 715 a pad oxide layer 305 is formed over the substrate using an oxidation process. The thickness of the pad oxide layer 305 can range from 200 Å to 400 Å. In operation 720, a nitride layer 310 is deposited over the pad oxide layer 305. The thickness of the nitride layer 310 ranges from 1000 Å to 1500 Å. In operation 725, a pattern is formed in the pad oxide layer 305 and nitride layer 310 using photolithography and etching. The photoresist is also removed in this operation. After the pattern is formed, in operation 730, a field oxide region 320 is formed in the epitaxial layer 302 and is recessed into the epitaxial layer 302 with some of the field oxide region 320 being above the epitaxial layer 302 plane. In operation 735, the field oxide region is planarized using a CMP etch process to generate a substantially planar surface having substantially planar regions of field oxide and epitaxial layer.

In operation 740, a hard mask oxide is grown. The hard mask will be used in subsequent operations to form various features including trenches 335. In operation 745 the hard mask is patterned. In operation 750, trenches 335 are formed using an etch process. In one embodiment the trenches 335 have a pitch ranging from 0.8-1.0 um, a critical dimension ranging from 0.4-0.6 um, and a depth ranging from 0.5-5.0 um. However, in other embodiments the trenches can have values for the pitch, critical dimension, and depth which are outside of these ranges. In operation 755, the hard mask is removed. The hard mask can be removed using various techniques or combinations of techniques such as etching, wet BOE, which just removes the remaining hard mask oxide with minimum attack to field oxide, or CMP which planarizes the field to active regions. In some embodiments, operation 755 is optional and the hard mask can be left on for future removal post polysilicon etch.

In operation 760, the shield dielectric layer 340 is formed so that it follows the contours of the trench and the substrate. The shield dielectric layer 340 can be formed by growing the oxide layer, depositing the oxide layer or combinations of growing and depositing the oxide. The shield dielectric layer 340 is formed along the bottom and sidewalls of the trench 335 and along the top of the epitaxial layer 302, the field oxide region 320 and an implant region 325. The shield dielectric layer 340 can have a thickness of approximately 400±50 Å. In some embodiments, the shield dielectric layer 340 can form a contiguous film along the bottom and sidewalls of the trench 335 and along the top of the epitaxial layer 302, the field oxide region 320 and the implant region 325. The shied oxide layer 340 can be formed by exposing the HED rectifier to oxygen diluted in an inert gas such as argon, helium, or xenon at high temperatures. In operation 765, the polysilicon 345 material is deposited inside the trench 335 and over the top of the shield dielectric layer 340. The polysilicon material is amorphous undoped polysilicon and has a thickness of approximately 5500 Å±500 Å. The polysilicon material can then be doped by implanting boron. In operation 770, excess polysilicon 335 material is removed and the polysilicon to silicon mesa regions are planarized. In one embodiment this planarization is performed using CMP. The CMP process removes the excess polysilicon 335 material disposed on top of the shield dielectric layer 340 outside of the trenches 335. The CMP process can also be used to remove some of the shield dielectric layer 340 disposed outside of the trench 335, leaving behind a thinner shield dielectric layer 340 outside of trenches 335 than inside of trenches 335. After the partial HED rectifier has been processed with CMP, the resulting partial HED rectifier has the shield dielectric layer 340 partially extending above the epitaxial layer 302 and trenches 335 with the polysilicon 345 material filling the trenches 335 up to the shield dielectric layer 340 and flush with the top of the shield dielectric layer 340. Planarizing the polysilicon using CMP generates a substantially planar surface having substantially planar regions of polysilicon, gate oxide and field oxide. The regions of polysilicon, gate oxide and field oxide formed by planarizing form a substantially flat contiguous surface. This process can be performed with or without a photo pattern.

In operation 775, a Schottky metallization layer is deposited. Next in operation 780, a Schottky barrier silicide is formed. In operation 785 a top metal 365 containing aluminum is formed. The top metal 365 is formed over a Schottky metallization layer and over a portion of the gate oxide layer. In operation 790 a dielectric layer 375 and STM layer 385 are formed. The dielectric layer 375 is formed according to a pattern and the STM layer 385 is formed over the top metal 365. In some embodiments the dielectric layer 375 is polyimide. Alternatively, the dielectric layer 375 can be PECVD oxy-nitride, PECVD nitride, BCB, oxy-nitride films that act as a dielectric material, polyimide and deposited silicon nitride, polyimide and deposited silicon dioxide, polyimide and deposited silicon oxy-nitride, silicon nitride, silicon oxy-nitride, silicon dioxide, or some other dielectric. In operation 795, STM layer 385 material is removed using CMP. The CMP process removes the excess STM layer 385 material disposed on top of the top metal 365 and next to the dielectric layer 375. After the partial HED rectifier has been processed with CMP, the resulting partial HED rectifier has dielectric layer 375 and the STM layer 385 substantially co-planar so that both form a flush top surface. Planarizing the STM layer 385 using CMP generates a substantially planar surface having substantially planar regions of dielectric layer 375 material and STM layer 385 material. The regions of dielectric layer 375 material and STM layer 385 material formed by planarizing form a substantially flat contiguous surface. Finally, in operation 798, the HED rectifier is completed.

Figure 8:
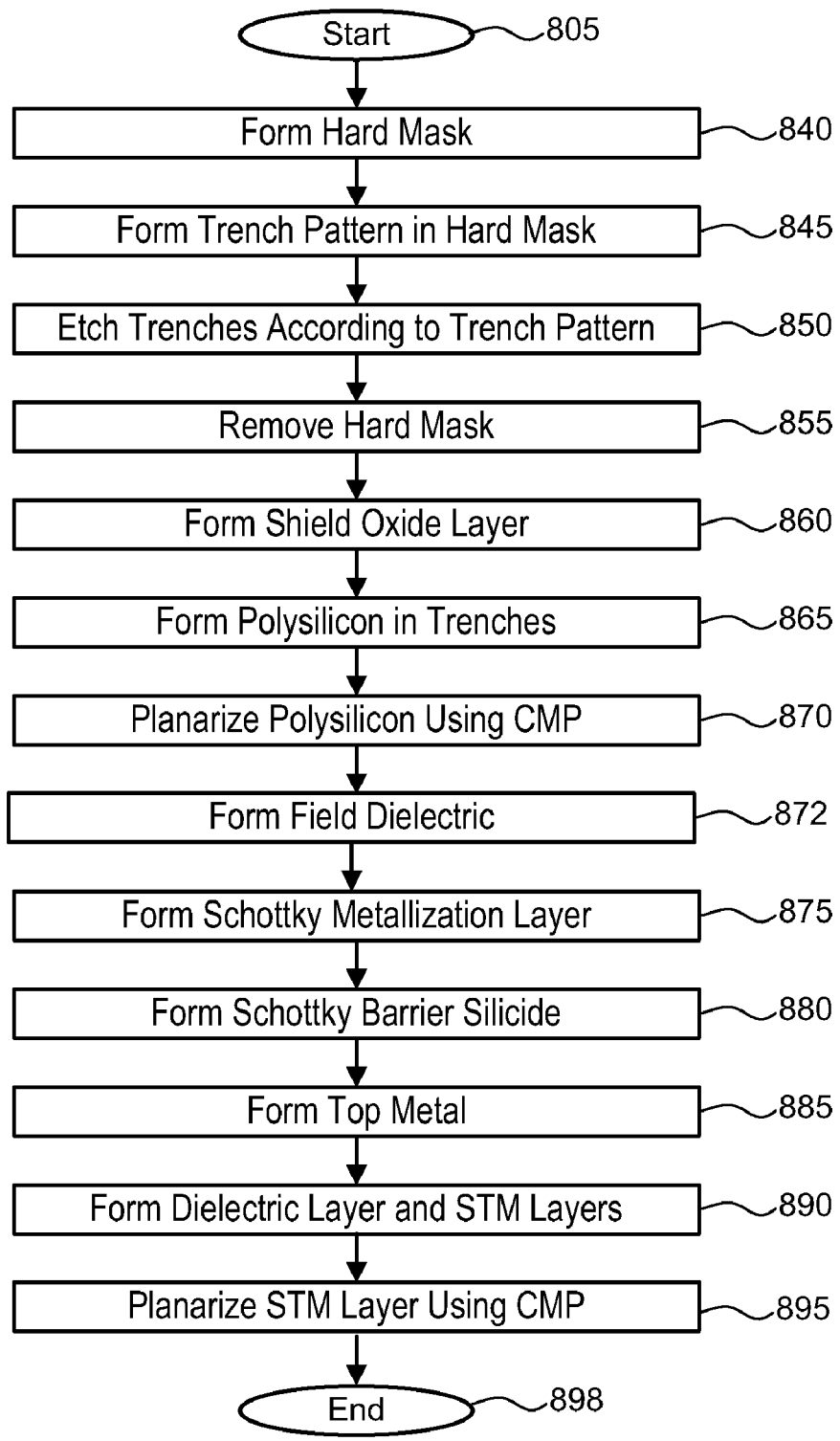
FIG. 8 is a flowchart illustrating a method of forming a semiconductor device using CMP to planarized polysilicon deposited in trenches and above an epitaxial layer disposed above a substrate and using CMP to planarized a STM layer.

FIG. 8 is a flowchart illustrating a method of forming a semiconductor device using CMP to planarize polysilicon deposited in trenches and above an epitaxial layer and using CMP to planarized a STM layer. The semiconductor device made using CMP to planarize the polysilicon and the STM layer has a planar structure between edge termination to trenches and trenches to mesa regions to reduce reverse leakage current caused by non-planarity. The method starts in operation 805 when a substrate is provided. The substrate can be an N-Type wafer with an epitaxial layer deposited on top. Next in operation 840, a hard mask oxide is grown. The hard mask will be used in subsequent operations to form various features including trenches 335. In operation 845 the hard mask is patterned. In operation 850, trenches 335 are formed using an etch process. In one embodiment the trenches 335 have a pitch ranging from 0.8-1.0 um, a critical dimension ranging from 0.4-0.6 um, and a depth ranging from 0.5-5.0 um. However, in other embodiments the trenches can have values for the pitch, critical dimension, and depth which are outside of these ranges. In operation 855, the hard mask is removed. The hard mask can be removed using various techniques or combinations of techniques such as etching, wet BOE, which just removes the remaining hard mask oxide, or CMP which planarizes the field to active regions. In some embodiments, operation 855 is optional and the hard mask can be left on for future removal post polysilicon etch.

In operation 860, the shield dielectric layer 340 is formed so that it follows the contours of the trench and the substrate. The shield dielectric layer 340 can be formed by growing the oxide layer, depositing the oxide layer or combinations of growing and depositing the oxide. The shield dielectric layer 340 is formed along the bottom and sidewalls of the trench 335 and along the top of the epitaxial layer 302, and an implant region 325. The shield dielectric layer 340 can have a thickness of approximately 400±50 Å. In some embodiments, the shield dielectric layer 340 can form a contiguous film along the bottom and sidewalls of the trench 335 and along the top of the epitaxial layer 302, and the implant region 325. The shied oxide layer 340 can be formed by exposing the HED rectifier to oxygen diluted in an inert gas such as argon, helium, or xenon at high temperatures. In operation 865, the polysilicon 345 material is deposited inside the trench 335 and over the top of the shield dielectric layer 340. The polysilicon material is amorphous undoped polysilicon and has a thickness of approximately 5500 Å±500 Å. The polysilicon material can then be doped by implanting boron. In operation 870, excess polysilicon 335 material is removed and the polysilicon to silicon mesa regions are planarized. In one embodiment this planarization is performed using CMP. The CMP process removes the excess polysilicon 335 material disposed on top of the shield dielectric layer 340 outside of the trenches 335. The CMP process can also be used to remove some of the shield dielectric layer 340 disposed outside of the trench 335, leaving behind a thinner shield dielectric layer 340 outside of trenches 335 than inside of trenches 335. After the partial HED rectifier has been processed with CMP, the resulting partial HED rectifier has the shield dielectric layer 340 partially extending above the epitaxial layer 302 and trenches 335 with the polysilicon 345 material filling the trenches 335 up to the shield dielectric layer 340 and flush with the top of the shield dielectric layer 340. Planarizing the polysilicon using CMP generates a substantially planar surface having substantially planar regions of polysilicon, and gate oxide. The regions of polysilicon and gate oxide formed by planarizing form a substantially flat contiguous surface. This process can be performed with or without a photo pattern.

Next in operation 872, a field dielectric region 320, which can be an oxide region, is formed in the epitaxial layer 302 and is recessed into the epitaxial layer 302 with some of the field dielectric region 320 being above the epitaxial layer 302 plane. In operation 875, a Schottky metallization layer is deposited. Next in operation 880, a Schottky barrier silicide is formed. In operation 885 a top metal 365 containing aluminum is formed. The top metal 365 is formed over a Schottky metallization layer and over a portion of the gate oxide layer. In operation 890 a dielectric layer 375 and STM layer 385 are formed. In some embodiments the dielectric layer 375 is polyimide. Alternatively, the dielectric layer 375 can be PECVD oxy-nitride, PECVD nitride, BCB, oxy-nitride films that act as a dielectric material, polyimide and deposited silicon nitride, polyimide and deposited silicon dioxide, polyimide and deposited silicon oxy-nitride, silicon nitride, silicon oxy-nitride, silicon dioxide, or some other dielectric. The dielectric layer 375 is formed according to a pattern and the STM layer 385 is formed over the top metal 365. In operation 895, STM layer 385 material is removed using CMP. The CMP process removes the excess STM layer 385 material disposed on top of the top metal 365 and next to the dielectric layer 375. After the partial HED rectifier has been processed with CMP, the resulting partial HED rectifier has dielectric layer 375 and the STM layer 385 substantially co-planar so that both form a flush top surface. Planarizing the STM layer 385 using CMP generates a substantially planar surface having substantially planar regions of dielectric layer 375 material and STM layer 385 material. The regions of dielectric layer 375 material and STM layer 385 material formed by planarizing form a substantially flat contiguous surface. Finally, in operation 898, the HED rectifier is completed.

Figure 9:
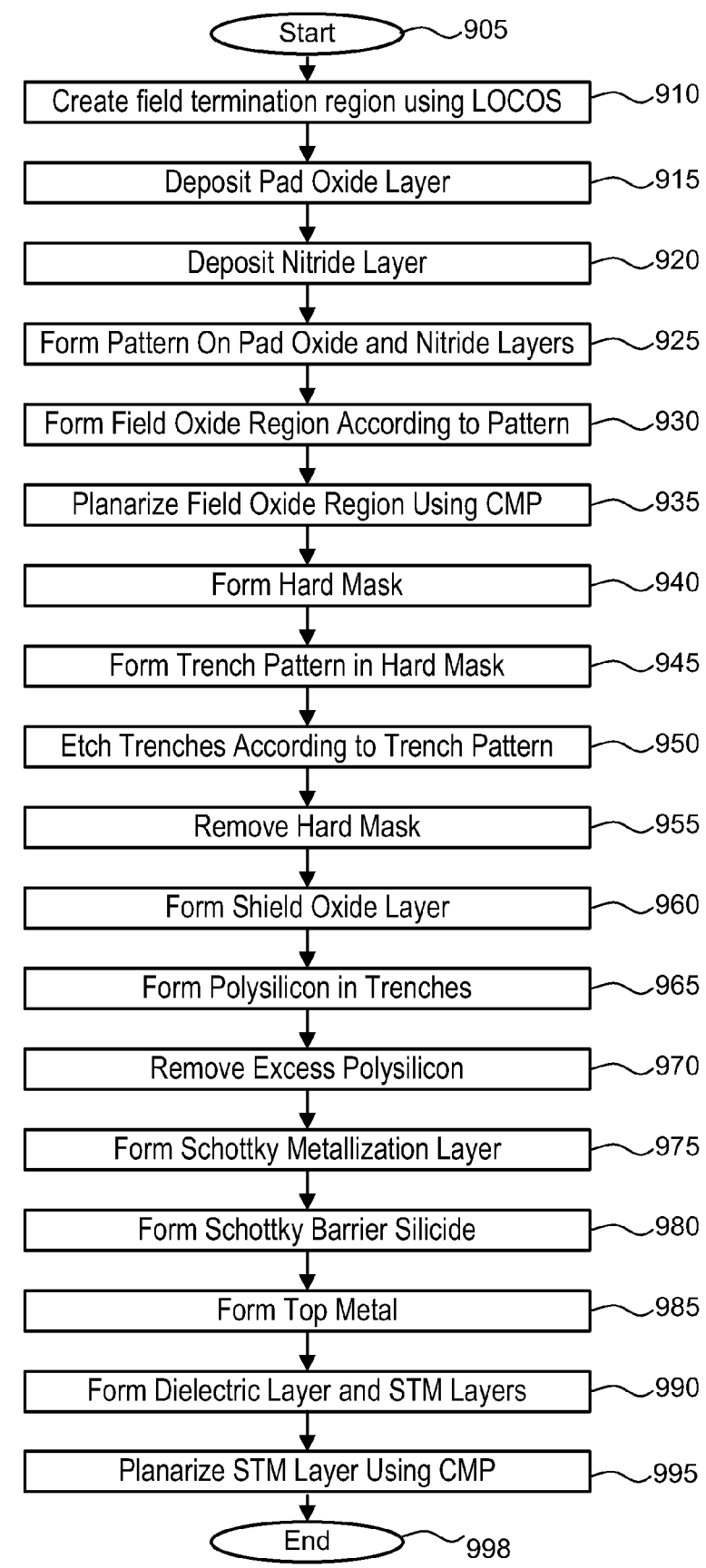
FIG. 9 is a flowchart illustrating a method of forming a semiconductor device using CMP to planarize an oxide layer and using CMP to planarized a STM layer.

FIG. 9 is a flowchart illustrating a method of forming a semiconductor device using CMP to planarize an oxide layer and using CMP to planarized a STM layer. The semiconductor device made using CMP to planarize the oxide layer and the STM layer has a planar structure between edge termination to trenches and trenches to mesa regions to reduce reverse leakage current caused by non-planarity. The method starts in operation 905 when a substrate is provided. The substrate can be an N-Type wafer with an epitaxial layer deposited on top. Next in operation 910 a field termination region is created using LOCOS oxidation methods. Next in operation 915 a pad oxide layer 305 is formed over the substrate using an oxidation process. The thickness of the pad oxide layer 305 can range from 200 Å to 400 Å. In operation 920, a nitride layer 310 is deposited over the pad oxide layer 305. The thickness of the nitride layer 310 ranges from 1000 Å to 1500 Å. In operation 925, a pattern is formed in the pad oxide layer 305 and nitride layer 310 using photolithography and etching. The photoresist is also removed in this operation. After the pattern is formed, in operation 930, a field oxide region 320 is formed in the epitaxial layer 302 and is recessed into the epitaxial layer 302 with some of the field oxide region 320 being above the epitaxial layer 302 plane. In operation 935, the field oxide region is planarized using a CMP etch process to generate a substantially planar surface having substantially planar regions of field oxide and epitaxial layer.

In operation 940, a hard mask oxide is grown. The hard mask will be used in subsequent operations to form various features including trenches 335. In operation 945 the hard mask is patterned. In operation 950, trenches 335 are formed using an etch process. In one embodiment the trenches 335 have a pitch ranging from 0.8-1.0 um, a critical dimension ranging from 0.4-0.6 um, and a depth ranging from 0.5-5.0 um. However, in other embodiments the trenches can have values for the pitch, critical dimension, and depth which are outside of these ranges. In operation 955, the hard mask is removed. The hard mask can be removed using various techniques or combinations of techniques such as etching, wet BOE, which just removes the remaining hard mask oxide with minimum attack to field oxide, or CMP which planarizes the field to active regions. In some embodiments, operation 955 is optional and the hard mask can be left on for future removal post polysilicon etch.

In operation 960, the shield dielectric layer 340 is formed so that it follows the contours of the trench and the substrate. The shield dielectric layer 340 can be formed by growing the oxide layer, depositing the oxide layer or combinations of growing and depositing the oxide. The shield dielectric layer 340 is formed along the bottom and sidewalls of the trench 335 and along the top of the epitaxial layer 302, the field oxide region 320 and an implant region 325. The shield dielectric layer 340 can have a thickness of approximately 400±50 Å. In some embodiments, the shield dielectric layer 340 can form a contiguous film along the bottom and sidewalls of the trench 335 and along the top of the epitaxial layer 302, the field oxide region 320 and the implant region 325. The shied oxide layer 340 can be formed by exposing the HED rectifier to oxygen diluted in an inert gas such as argon, helium, or xenon at high temperatures. In operation 965, the polysilicon 345 material is deposited inside the trench 335 and over the top of the shield dielectric layer 340. The polysilicon material is amorphous undoped polysilicon and has a thickness of approximately 5500 Å±500 Å. The polysilicon material can then be doped by implanting boron. In operation 970, excess polysilicon 335 material is removed. In one embodiment, the excess polysilicon 335 is removed using an ONO etch process. This process can be performed with or without a photo pattern.

In operation 975, a Schottky metallization layer is deposited. Next in operation 980, a Schottky barrier silicide is formed. In operation 985 a top metal 365 containing aluminum is formed. The top metal 365 is formed over a Schottky metallization layer and over a portion of the gate oxide layer. In operation 990 a dielectric layer 375 and STM layer 385 are formed. The dielectric layer 375 is formed according to a pattern and the STM layer 385 is formed over the top metal 365. In operation 995, STM layer 385 material is removed using CMP. The CMP process removes the excess STM layer 385 material disposed on top of the top metal 365 and next to the dielectric layer 375. After the partial HED rectifier has been processed with CMP, the resulting partial HED rectifier has dielectric layer 375 and the STM layer 385 substantially co-planar so that both form a flush top surface. Planarizing the STM layer 385 using CMP generates a substantially planar surface having substantially planar regions of dielectric layer 375 material and STM layer 385 material. The regions of dielectric layer 375 material and STM layer 385 material formed by planarizing form a substantially flat contiguous surface. In some embodiments the dielectric layer 375 is polyimide. Alternatively, the dielectric layer 375 can be PECVD oxy-nitride, PECVD nitride, BCB, oxy-nitride films that act as a dielectric material, polyimide and deposited silicon nitride, polyimide and deposited silicon dioxide, polyimide and deposited silicon oxy-nitride, silicon nitride, silicon oxy-nitride, silicon dioxide, or some other dielectric. Finally, in operation 998, the HED rectifier is completed.

Figure 10:
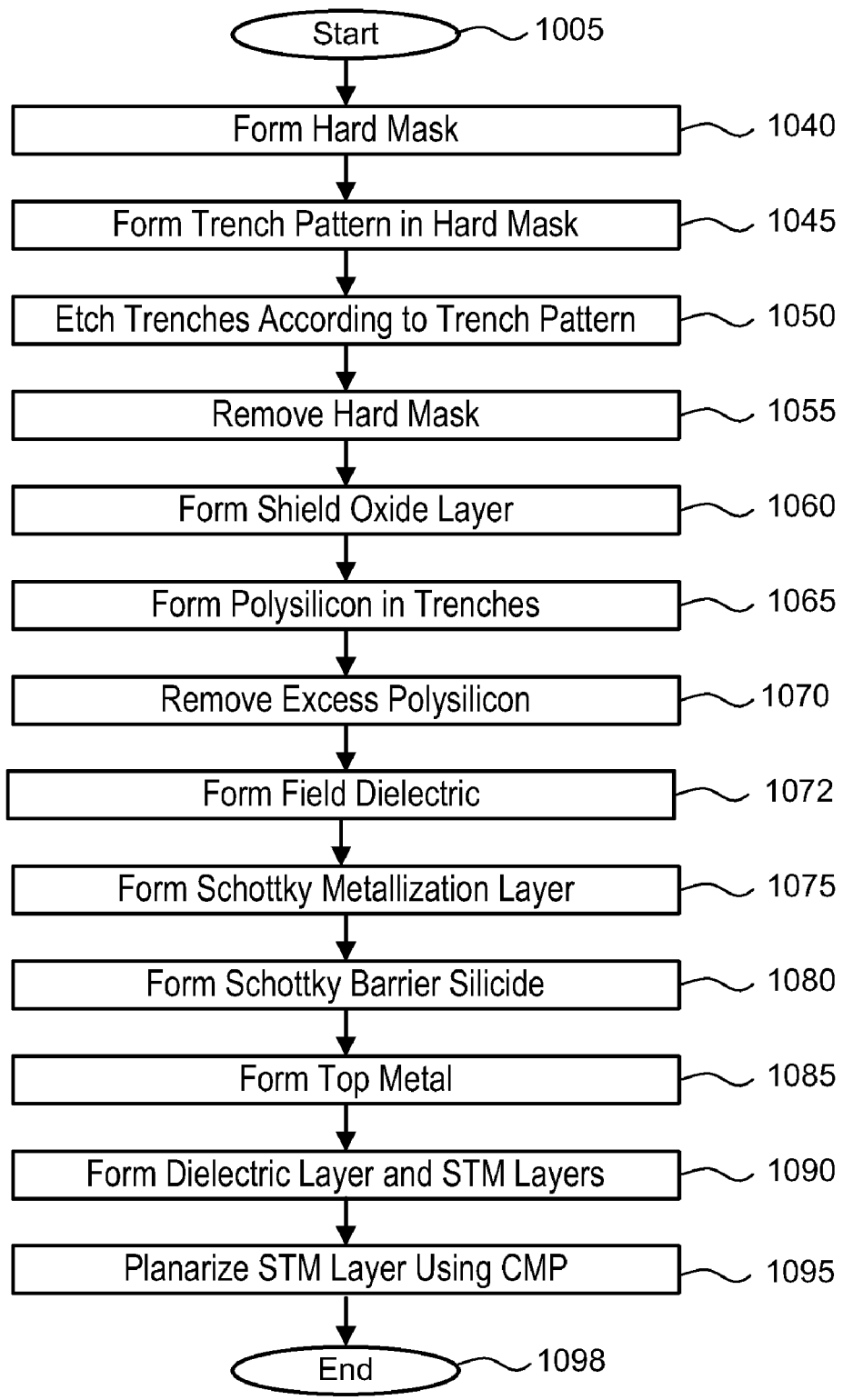
FIG. 10 is a flowchart illustrating a method of forming a semiconductor device using CMP to planarized a STM layer.

FIG. 10 is a flowchart illustrating a method of forming a semiconductor device using CMP to planarized a STM layer. The semiconductor device made using CMP to planarize the STM layer has a planar structure between edge termination to trenches and trenches to mesa regions to reduce reverse leakage current caused by non-planarity. The method starts in operation 1005 when a substrate is provided. The substrate can be an N-Type wafer with an epitaxial layer deposited on top. Next in operation 1040, a hard mask oxide is grown. The hard mask will be used in subsequent operations to form various features including trenches 335. In operation 1045 the hard mask is patterned. In operation 1050, trenches 335 are formed using an etch process. In one embodiment the trenches 335 have a pitch ranging from 0.8-1.0 um, a critical dimension ranging from 0.4-0.6 um, and a depth ranging from 0.5-5.0 um. However, in other embodiments the trenches can have values for the pitch, critical dimension, and depth which are outside of these ranges. In operation 1055, the hard mask is removed. The hard mask can be removed using various techniques or combinations of techniques such as etching, wet BOE, which just removes the remaining hard mask oxide, or CMP which planarizes the field to active regions. In some embodiments, operation 1055 is optional and the hard mask can be left on for future removal post polysilicon etch.

In operation 1060, the shield dielectric layer 340 is formed so that it follows the contours of the trench and the substrate. The shield dielectric layer 340 can be formed by growing the oxide layer, depositing the oxide layer or combinations of growing and depositing the oxide. The shield dielectric layer 340 is formed along the bottom and sidewalls of the trench 335 and along the top of the epitaxial layer 302, and an implant region 325. The shield dielectric layer 340 can have a thickness of approximately 400±50 Å. In some embodiments, the shield dielectric layer 340 can form a contiguous film along the bottom and sidewalls of the trench 335 and along the top of the epitaxial layer 302, and the implant region 325. The shied oxide layer 340 can be formed by exposing the HED rectifier to oxygen diluted in an inert gas such as argon, helium, or xenon at high temperatures. In operation 1065, the polysilicon 345 material is deposited inside the trench 335 and over the top of the shield dielectric layer 340. The polysilicon material is amorphous undoped polysilicon and has a thickness of approximately 5500 Å±500 Å. The polysilicon material can then be doped by implanting boron. In operation 1070, excess polysilicon 335 material is removed. In one embodiment, the excess polysilicon 335 is removed using an ONO etch process. This process can be performed with or without a photo pattern.

Next in operation 1072, a field dielectric region 320, which can be an oxide region, is formed in the epitaxial layer 302 and is recessed into the epitaxial layer 302 with some of the field dielectric region 320 being above the epitaxial layer 302 plane. In operation 1075, a Schottky metallization layer is deposited. Next in operation 1080, a Schottky barrier silicide is formed. In operation 1085 a top metal 365 containing aluminum is formed. The top metal 365 is formed over a Schottky metallization layer and over a portion of the gate oxide layer. In operation 1090 a dielectric layer 375 and STM layer 385 are formed. In some embodiments the dielectric layer 375 is polyimide. Alternatively, the dielectric layer 375 can be PECVD oxy-nitride, PECVD nitride, BCB, oxy-nitride films that act as a dielectric material, polyimide and deposited silicon nitride, polyimide and deposited silicon dioxide, polyimide and deposited silicon oxy-nitride, silicon nitride, silicon oxy-nitride, silicon dioxide, or some other dielectric. The dielectric layer 375 is formed according to a pattern and the STM layer 385 is formed over the top metal 365. In operation 1095, STM layer 385 material is removed using CMP. The CMP process removes the excess STM layer 385 material disposed on top of the top metal 365 and next to the dielectric layer 375. After the partial HED rectifier has been processed with CMP, the resulting partial HED rectifier has dielectric layer 375 and the STM layer 385 substantially co-planar so that both form a flush top surface. Planarizing the STM layer 385 using CMP generates a substantially planar surface having substantially planar regions of dielectric layer 375 material and STM layer 385 material. The regions of dielectric layer 375 material and STM layer 385 material formed by planarizing form a substantially flat contiguous surface. Finally, in operation 1098, the HED rectifier is completed.

Figure 11:
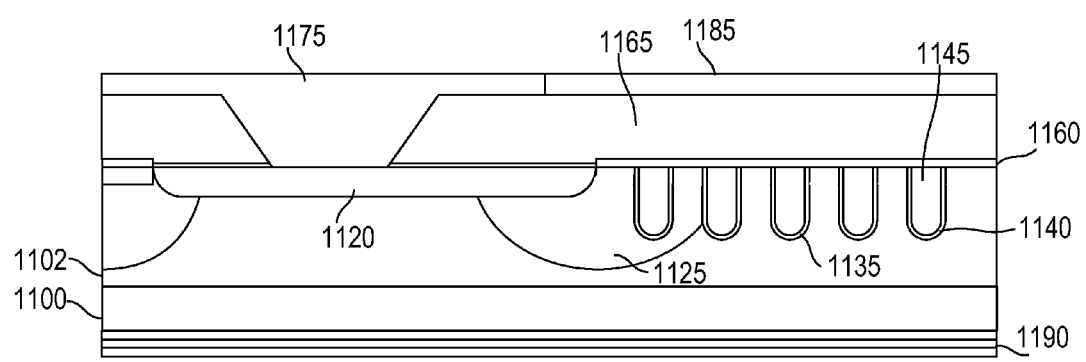
FIG. 11 illustrates a cross section view of a semiconductor device made in accordance with the methods described above with reference to FIGS. 3-10.

FIG. 11 illustrates a cross section view of a semiconductor device made along cutline A-A' illustrated in FIG. 2C, in accordance with the methods described above with reference to FIGS. 3-10. The semiconductor device illustrated in FIG. 11 is an HED rectifier made using CMP to planarized the field oxide layer, the polysilicon and/or the STM layer. The semiconductor device has a planar structure between edge termination to trenches and trenches to mesa regions to reduce reverse leakage current caused by non-planarity. The semiconductor device includes a substrate 1100, an epitaxial layer 1102, a field oxide region 1120, an implant region 1125, trenches 1135, a shield dielectric layer 1140, polysilicon 1145, a NiSi layer 1160, a top metal 1165, a dielectric layer 1175, an STM layer 1185, and a back metal 1190. The substrate 1100 can be an N-type wafer which has been previously scribed with a laser to include information such as device type, lot number, and wafer number. The substrate 1100 can also be a highly doped N+ substrate. The epitaxial layer 1102, which is formed over the substrate 1100, can be made of the same conductivity or different conductivity than the substrate 1100. MOSFETs are formed when the substrate 1100 and epitaxial layer 1102 are of the same conductivity type, and IGBTs are formed when the substrate 1100 has the opposite conductivity type to that of the epitaxial layer 1102. In some embodiments, the epitaxial layer 1102 is made of lightly doped n-type material. The field oxide region 1120 extends into the epitaxial layer 1102 and has a top surface that is coplanar with a top surface of the epitaxial layer 1102. In some embodiments this coplanar surface is produced using CMP.

The implant region 1125 is produced by implanting boron into the epitaxial layer 1102. In some embodiments, the implantation energy is increased in order to produce a P-iso under the field oxide layer 1120. The trenches 1135 are formed by etching and have a final thickness that ranges from about 2250 Å to about 2450 Å and the final depth that ranges from about 1275 nm to about 1555 nm. The width and depth of the trenches can vary outside of these ranges. In one embodiment the depth of the trenches is approximately 1415 nm. The shield dielectric layer 1140 can have a thickness of approximately 400±50 Å and follows the contours of the trench and the substrate. The shield dielectric layer 1140 is grown so that it lines the bottom and sidewalls of the trench 1135 and along the top of the epitaxial layer 1102, the field oxide region 1120 and an implant region 1125. In some embodiments, the shield dielectric layer 1140 can form a contiguous film along the bottom and sidewalls of the trench 1135 and along the top of the epitaxial layer 1102, the field oxide region 1120 and the implant region 1125. The polysilicon material 1145 which is deposited into the trenches 1135 and over the shield dielectric layer 1140 is amorphous undoped polysilicon and has a thickness of approximately 5500 Å±500 Å. The polysilicon material 1145 is then doped by implanting boron. The polysilicon material 1145 substantially fills the trenches 1135 and produces a structure where the polysilicon material 1145 has a top surface that is coplanar with top surfaces of the gate oxide and/or the field oxide 1120. In some embodiments this coplanar surface is produced using CMP.

The NiSi layer 1160 is formed by first depositing nickel over the planarized region having exposed polysilicon 1145 in the trenches 1135 and exposed silicon which form the mesas between the trenches 1135, and then subjecting the nickel to external heat generated by sources such as rapid thermal anneal (RTA), hot chuck, and furnace sources (other heat sources can be used and the heat sources are not limited to these). NiSi forms when the nickel is exposed to the silicon from substrate 1100 and is subjected to external heat generated by sources such as rapid thermal anneal (RTA), hot chuck, and furnace sources (other heat sources can be used and the heat sources are not limited to these). In some embodiments un-reacted residual nickel is present. In some embodiments that Nickel layer can be sputter deposited and the thickness can be approximately 600 Å. The top layer 1165 is made of Al/Si/Cu, which is formed over the NiSi layer 1160 and the shield dielectric layer 1140, which has been deposited over the field oxide region 1120. The top layer 1165 includes an opening which is filled with dielectric layer 1175. In one embodiment, the dielectric layer 1175 is polyimide. Alternatively, the dielectric layer 1175 can be PECVD oxy-nitride, PECVD nitride, BCB, oxy-nitride films that act as a dielectric material, polyimide and deposited silicon nitride, polyimide and deposited silicon dioxide, polyimide and deposited silicon oxy-nitride, silicon nitride, silicon oxy-nitride, silicon dioxide, or some other dielectric. The dielectric layer 1175 is deposited over a portion of the top layer 1165 and fills the opening. The STM layer 1185 is made of a solderable material such as Ti/NiV/Ag, Ta/Cu, tin or other solderable metals. The STM layer 1185 can be formed using various deposition methods such as electroless deposition. The dielectric layer 1175 and the STM layer 1185 form a substantially planar surface which can be produced using CMP. The back metal 1190 is formed on the back side of the substrate 1100. The back metal 1190 can include layers of Ti, NiV and Ag or other solderable metals, which are formed on the back of the substrate 1100 after the back of the substrate 1100 has undergone a mechanical back grinding process that grinds off a portion the substrate 1100.

Although specific embodiments of the invention have been described, various modifications, alterations, alternative constructions, and equivalents are also encompassed within the scope of the invention. The described invention is not restricted to operation within certain specific embodiments, but is free to operate within other embodiments configurations as it should be apparent to those skilled in the art that the scope of the present invention is not limited to the described series of transactions and steps.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. A semiconductor device, comprising:
   an epitaxial layer;
   a silicide layer disposed on at least a portion of the epitaxial layer;
   a field oxide extending into the epitaxial layer;
   a substantially planar surface including a substantially planar region of the field oxide and a substantially planar region of the epitaxial layer, the substantially planar surface being in contact with a substantially planar bottom surface of the silicide layer;
   a trench disposed in the epitaxial layer, the trench having a trench sidewall and a bottom;
   a shield dielectric lining the trench sidewall and the bottom of the trench, the shield dielectric being disposed on at least a portion of the field oxide; and
   a polysilicon disposed in the trench.

2. The semiconductor device of claim 1, wherein the substantially planar surface is formed using chemical mechanical planarization (CMP).

3. The semiconductor device of claim 1, wherein the substantially planar surface is a contiguous surface.

4. The semiconductor device of claim 1, wherein silicide layer and the epitaxial layer form at least a portion of a Schottky rectifier.

5. The semiconductor device of claim 1, further comprising:
   a mesa defining at least a portion of the trench sidewall of the trench, the substantially planar surface including a substantially planar region of the polysilicon, a substantially planar region of the shield dielectric and a substantially planar region of the mesa.

6. The semiconductor device of claim 1, wherein the substantially planar bottom surface of the silicide layer is in contact with at least a portion of the shield dielectric and at least a portion of the polysilicon.

7. The semiconductor device of claim 1, wherein the silicide layer is electrically coupled to the polysilicon disposed in the trench.

8. The semiconductor device of claim 1, wherein the substantially planar region is a substantially planar first region, the semiconductor device further comprising:
   a top metal having a first portion disposed above the field oxide and a second portion disposed on at least a portion of the silicide layer;
   a dielectric layer;
   a solderable top metal (STM) layer adjacent to the dielectric layer; and a substantially planar second surface including a substantially planar region of the dielectric layer disposed on the first portion of the top metal, a substantially planar first region of the STM layer disposed on the first portion of the top metal, and a substantially planar second region of the STM layer disposed on the second portion of the top metal.

9. A semiconductor device, comprising:
an epitaxial layer;
a silicide layer disposed on at least a portion of the epitaxial layer;
a field oxide extending into the epitaxial layer;
a trench disposed in the epitaxial layer and below the silicide layer;
a top metal having a first portion disposed above the field oxide and a second portion disposed on at least a portion of the silicide layer;
a dielectric layer;
a solderable top metal (STM) layer adjacent to the dielectric layer; and
a substantially planar surface including a substantially planar region of the dielectric layer disposed on the first portion of the top metal, a substantially planar first region of the STM layer disposed on the first portion of the top metal, and a substantially planar second region of the STM layer disposed on the second portion of the top metal.

10. The semiconductor device of claim 9, wherein the substantially planar surface is formed using chemical mechanical planarization (CMP).

11. The semiconductor device of claim 9, wherein the substantially planar surface is a substantially planar first surface,
the semiconductor device further comprising:
a substantially planar second surface including a substantially planar region of the field oxide and a substantially planar region of the epitaxial layer, the substantially planar second surface being formed using chemical mechanical planarization (CMP).

12. The semiconductor device of claim 9, wherein the dielectric layer includes polyimide.

13. The semiconductor device of claim 9, wherein the silicide layer and the epitaxial layer form at least a portion of a Schottky rectifier.

14. The semiconductor device of claim 9, wherein the substantially planar surface is a substantially planar first surface,
the semiconductor device further comprising:
a polysilicon disposed in the trench;
a mesa defining at least a portion of a trench sidewall of the trench; and
a substantially planar second surface including a substantially planar region of the polysilicon, a substantially planar region of a shield dielectric disposed in the trench, and a substantially planar region of the mesa.

15. The semiconductor device of claim 9, wherein the trench has a trench sidewall and a bottom,
the semiconductor device further comprising:
a shield dielectric lining the trench sidewall and the bottom of the trench, the shield dielectric being disposed between the field oxide and the first portion of the top metal.

16. The semiconductor device of claim 9, wherein the trench has a trench sidewall and a bottom,
the semiconductor device further comprising:
a shield dielectric lining the trench sidewall and the bottom of the trench, the shield dielectric being disposed above at least a portion of the field oxide.

17. The semiconductor device of claim 9, further comprising:
a polysilicon disposed within the trench and coupled to the silicide layer, the STM layer being electrically coupled to the polysilicon via the top metal and the silicide layer.

18. The semiconductor device of claim 9, wherein the substantially planar surface is a substantially planar first surface,
the semiconductor device further comprising:
a substantially planar second surface including a substantially planar region of the field oxide and a substantially planar region of the epitaxial layer; and
a substantially planar third surface including a substantially planar region of polysilicon, and a substantially planar region of a shield dielectric disposed in the trench.

19. The semiconductor device of claim 9, wherein the STM layer includes at least one of Titanium, Nickel, Silver, Copper, or Tantalum.

* * * * *